United States Patent [19]
Eriguchi

[11] Patent Number: 5,985,032
[45] Date of Patent: Nov. 16, 1999

[54] SEMICONDUCTOR MANUFACTURING APPARATUS

[75] Inventor: Koji Eriguchi, Osaka, Japan

[73] Assignee: Matsushita Electric Industrial Co., Ltd., Osaka, Japan

[21] Appl. No.: 08/645,982

[22] Filed: May 14, 1996

[30] Foreign Application Priority Data

May 17, 1995 [JP] Japan .................................. 7-118383

[51] Int. Cl.$^6$ .................................................. C23C 16/00
[52] U.S. Cl. ..................... 118/712; 118/713; 156/345; 204/298.03; 204/298.32
[58] Field of Search .................................. 118/712, 713, 118/714; 204/298.03, 298.32; 156/345; 134/1.1

[56] References Cited

U.S. PATENT DOCUMENTS

| | | | |
|---|---|---|---|
| 4,902,631 | 2/1990 | Downey et al. .......................... | 437/7 |
| 5,215,588 | 6/1993 | Rhieu ....................................... | 118/715 |
| 5,380,366 | 1/1995 | Becker et al. .......................... | 118/712 |
| 5,509,375 | 4/1996 | Sayka et al. ............................ | 118/712 |
| 5,536,359 | 7/1996 | Kawada et al. ........................ | 156/626.1 |
| 5,565,114 | 10/1996 | Saito et al. ............................. | 216/60 |
| 5,782,974 | 7/1998 | Sorensen et al. ....................... | 117/82 |
| 5,843,232 | 12/1998 | Savkar et al. .......................... | 115/712 |

*Primary Examiner*—Bruce Breneman
*Assistant Examiner*—Luz Alejandro
*Attorney, Agent, or Firm*—McDermott, Will & Emery

[57] ABSTRACT

In the process of dry etching or the like, the bond between specific atoms contained in a deposit attached on the interior wall of a chamber and composed of an etching by-product is monitored by using an infrared ray. An incoming infrared ray generated from a light source for monitoring is directed to the deposit so that the absorption spectrum of an outgoing infrared ray passing through the deposit is measured by an infrared-ray measuring device. As a result, accurate information on the inside of the chamber can be obtained and a reduction in production yield due to variations in etching characteristics and generated particles can be prevented. Moreover, the availability of an apparatus can be increased by optimizing a maintenance cycle based on a specific variation in the absorption spectrum of the infrared ray. In particular, process administration and process control in such processing using plasma as dry etching and plasma CVD can be improved.

10 Claims, 17 Drawing Sheets

SEMICONDUCTOR MANUFACTURING APPARATUS

BACKGROUND OF THE INVENTION

The present invention relates to a method of monitoring a deposit in a chamber wherein such processing as etching or CVD is performed, to a method of plasma processing, to a method of dry-cleaning a chamber, and to a semiconductor manufacturing apparatus.

With the increasing miniaturization of semiconductor devices in recent years, the problem of increased investment in plants and equipment has become more conspicuous. To efficiently make profits from recovering the investment, it is essential to reduce production cost and increase production yield. In the process of manufacturing a semiconductor device, in particular, individual process steps and the structure of the semiconductor device have increased in complexity, which inevitably necessitates improved methods of administering and controlling the process. The following are conventional techniques used to administer and control the process of manufacturing semiconductor devices with regard to dry etching for patterning a conductive film and an insulating film.

To implement a conventional method of process administration for dry etching, periodic maintenance is performed with respect to a dry-etching apparatus based on the number of processed wafers (number of lots). Specifically, periodic maintenance is performed with respect to the dry-etching apparatus when the number of processed wafers has reached a given value empirically determined to maintain required etching performance, since the number of particles in the chamber increases with the number of wafers processed in the manufacturing process. Similar process control and administration is performed in another processing using plasma, such as plasma CVD.

In a conventional method of process control, if dry etching is performed to remove a given film in a semiconductor device, e.g., the emission intensity of a specific particle in the plasma varies at the completion of removal of the film in the absence of a material to be processed. When the variation reaches a given value or higher, it is judged that dry etching should be completed.

However, the above conventional method of controlling the dry-etching process has the following problems.

Even if emission light from the specific particle is monitored, it does not reflect the representative state of the entire chamber. For instance, as increases in the number of processed wafers (number of processed lots) change the state of the interior wall of the chamber with time, plasma parameters also change. The changing of the plasma parameters in turn causes variations in etching characteristics. Eventually, when the process control becomes unsuitable for the current state, production yield is lowered. For example, when the state of a deposit on the interior wall of the chamber changes, the concentration (density) of a specific active species in the plasma also changes, resulting in a variation in etching rate and a reduction in etching selectivity. Such deteriorations of the etching characteristics may cause an abrupt processing failure or the like.

On the other hand, the above conventional method of administering the dry-etching process has the following problems.

In the above conventional method, the judgment of whether or not periodic maintenance should be performed is not based on any theoretical endorsement but is based on the empirical parameter of the number of processed wafers, so that it is difficult to attain the intended object successfully. For example, unnecessary maintenance is performed oftentimes. Moreover, the availability of the apparatus is lowered by such a factor as the time required by a dry-etching process, which is performed with respect to a wafer for monitoring in order to check various parameters including the number of particles and etching rate.

The problems as mentioned above arise not only with the dry-etching process but also with all types of processing that may produce a deposit on the interior wall of the chamber, involving or not involving the use of a plasma, such as plasma CVD, CVD not using a plasma, and sputtering.

In the case of dry-cleaning a chamber where cleaning gas is allowed to flow in a chamber to remove a deposit attached on the interior wall of the chamber during plasma processing, the cleaning period has conventionally been set out of experiences so that it is not necessarily optimum. As a result, even after dry cleaning is performed, the number of counted particles is not within speculations so that cleaning should be performed again, which partly contributes to low efficiency and reduced availability of the apparatus.

Although the time at which dry etching should be completed is generally judged through a monitor window, a deposit attached on the inner surface of the monitor window reduces the intensity of light for monitoring, which prevents a correct judgment from being made.

SUMMARY OF THE INVENTION

A first object of the present invention is to provide a chamber for use in processing that may produce a deposit on the interior wall thereof with means for monitoring the state of the deposit attached on the interior wall of the chamber without opening it.

A second object of the present invention is to provide the chamber with means for preventing the misjudgment of the time at which dry etching should be completed due to a deposit attached on a monitor window through which a plasma is monitored during dry etching.

A third object of the present invention is to implement optimum cleaning time and efficient maintenance when dry cleaning is performed to remove the deposit attached on the interior wall of the chamber without opening it.

A fourth embodiment of the present invention is to provide a semiconductor manufacturing apparatus which can be used to attain the above three objects.

To attain the above first object, a method of monitoring a deposit in a chamber according to the present invention comprises the steps of: forming a part of the chamber with a window for electromagnetic wave permitting at least any one of electromagnetic waves including a light beam, an X-ray beam, and an electron beam to pass therethrough; introducing the above electromagnetic wave into the above chamber from an outside of the above chamber through the above window for electromagnetic wave; ejecting the electromagnetic wave passing through the deposit in the above chamber from the above chamber to the outside thereof; and measuring absorption of the above ejected electromagnetic wave by the above deposit to monitor a state of the above deposit.

In a material composing the deposit attached on the interior wall of the chamber, an interatomic bond specific to the material exists. The bonding state is represented by the energy states of electrons associated with bonding. The energy states of the electrons are expressed as vibration, expansion and contraction, and deformation mode. Although the electronic states can only have discrete energy values due to quantum-mechanic restraints, since individual energy levels are extremely close to each other, the majority of electronic states form an energy band that can be considered as a single band. When an electromagnetic wave enters a compound composing the deposit, photons corresponding to a band gap defining the energy state of each interatomic bond in the compound are absorbed. For example, when a bond exists between a C atom and a Br atom in the deposit, there is a gap of 1450 to 1400 $cm^{-1}$ between energy bands so that the photons in the region are absorbed to shift the interatomic bond to the high energy state. If the spectrum of the incoming electromagnetic wave is compared with that of the electromagnetic wave passing through the deposit, absorption is observed in a given region of the spectrum. Consequently, by detecting information on the absorption of the electromagnetic wave, information on the bonding state in the deposit attached on the interior wall of the chamber and variations with time in the total amount of the deposit (film thickness) can be obtained.

In other words, by monitoring the thickness of the deposit attached on the interior wall of the chamber, means for preventing trouble resulting from the generation of particles in the chamber, variations in processing conditions, and a reduction in availability at the proper time can be provided.

There can be formed first and second windows for electromagnetic wave at two opposing positions of the above chamber so that the electromagnetic wave introduced into the above chamber through the above first window for electromagnetic wave is ejected from the chamber to the outside thereof through the above second window for electromagnetic wave.

By the method, information on the deposit in the chamber can be obtained at two positions, so that the accuracy with which the thickness of the deposit or the like is measured is improved.

The above electromagnetic wave can be introduced into the chamber through the above first window for electromagnetic wave, directed to the deposit on an interior wall of the above chamber located between the above first and second windows for electromagnetic wave, reflected after passing through the deposit, and ejected from the chamber to the outside thereof through the above second window for electromagnetic wave.

By the method, information on the deposit can be obtained at three positions, so that the accuracy of measurement is further increased.

A part of the above chamber may be provided with a cylindrical monitoring member outwardly protruding and closed at a tip thereof, the above cylindrical monitoring member being formed with first and second windows for electromagnetic wave at two opposing positions of a side thereof so that the electromagnetic wave is introduced into the chamber through the above first window for electromagnetic wave, reflected after passing through the deposit on an inner surface of the tip of the above cylindrical monitoring member, and ejected from the above chamber to the outside thereof through the above second window for electromagnetic wave.

By the method, information on the deposit can be obtained with the use of the electromagnetic wave not passing through a plasma generation region in the chamber. Consequently, the thickness of the deposit can be measured without being affected by light generated from a plasma, while restraints on the type of a usable electromagnetic wave are lessened and the accuracy of measurement is increased.

The state of the above deposit can be monitored by using an electromagnetic wave seeping into the above deposit on an inner surface of the above window for electromagnetic wave and partly absorbed by the above deposit when the electromagnetic wave entering the above window for electromagnetic wave from an outer surface thereof is totally reflected by the inner surface of the above window for electromagnetic wave.

By the method, the state of the deposit can be monitored without particularly modifying the window for electromagnetic wave through which the deposit is monitored. It is well known that when the electromagnetic wave travelling through the first medium is totally reflected by the interface with the second medium, a part of the electromagnetic wave becomes an evanescent wave which seeps into the second medium and is reflected back to the first medium. Accordingly, the type and thickness of the deposit can be obtained by detecting, after the evanescent wave has seeped into the deposit on the inner surface of the window for electromagnetic wave, information on the absorption of the evanescent wave by the deposit resulting from the interaction therebetween.

The above deposit is a polymer of at least either one of carbon and silicon and a halogen element, the above electromagnetic wave is an infrared ray, and the state of the above deposit can be monitored by measuring an absorption spectrum of the infrared ray passing through the above deposit.

By the method, the spectrum of the incoming infrared ray is compared with the absorption spectrum of the infrared ray passing through the deposit so that the thickness of the deposit or the like is determined based on the result of comparison. On the other hand, it is well known that a deposit produced through the etching or CVD of a silicon dioxide film or a polysilicon film frequently used in the process of manufacturing a semiconductor device is a polymer of at least either one of carbon and silicon and a halogen element. The wavelength of the electromagnetic wave corresponding to the value of the gap between energy bands in the deposit falls in the infrared region. As a result, it becomes possible to accurately monitor the state of the deposit produced during plasma processing with the use of an infrared ray that can be used most readily and conveniently.

Of the above absorption spectrum of the infrared ray, a portion with a wave number of 2000 $cm^{-1}$ or less is preferably measured.

In the case where the above deposit is produced when a material to be processed composed of silicon is processed with a plasma, a portion with a wave number in a range of 1450 to 1400 $cm^{-1}$ of the above absorption spectrum of the infrared ray is preferably measured.

By the method, it becomes possible to recognize the state of the deposit during plasma processing extremely promptly and accurately by measuring only the infrared ray in the range of wave numbers corresponding to the value of the gap between energy bands in the deposit produced in processing a silicon single-crystal film and a polysilicon film with a plasma.

In the case where the above deposit is produced when a material to be processed composed of silicon dioxide is processed, a portion with a wave number in a range of 1300 to 800 $cm^{-1}$ of the above absorption spectrum of the infrared ray is preferably measured.

By the method, it becomes possible to promptly recognize the state of the deposit during plasma processing by measuring only the infrared ray in the range of wave numbers corresponding to the value of the gap between energy bands in the deposit produced in processing the silicon dioxide film with a plasma.

The above chamber is constructed such that plasma processing is performed therein and, after a variation in a emission intensity of a plasma in the chamber is measured and a sensitivity with which the emission intensity is measured is compensated such that the emission intensity at an initiation of the plasma processing has a constant initial value, when process control is performed with respect to the plasma processing based on a variation in the compensated emission intensity, the state of the above deposit can be monitored to compensate the sensitivity with which the emission intensity is measured.

By the method, process control is performed with regard to plasma processing based on accurate information on the deposit, while the state of the deposit in the chamber is monitored. Consequently, process control including the judgment of the time at which dry etching should be completed can be performed more reliably with regard to plasma processing.

The state of the above deposit can be monitored to determine a time at which maintenance should be performed with respect to the chamber.

By the method, the timing for maintenance can be judged accurately without the trouble of mounting a wafer for monitoring or counting the number of particles and without incurring an error by empirically judging the timing for maintenance based on the number of processed wafers. This enables the extension of the maintenance cycle and the improvement of the availability of the chamber.

To attain the above second object, a method of plasma processing according to the present invention is implemented by using a plasma processing apparatus, the above apparatus having a chamber and a window for plasma provided in a part of the above chamber to measure light emitted from a plasma in the chamber, the above method comprising: a first step of mounting a material to be processed in the above chamber; a second step of introducing processing gas having such a characteristic as to produce a deposit during plasma processing; a third step of ionizing the introduced processing gas with an RF electric field to generate the plasma and processing the above material to be processed by utilizing the above plasma; and a fourth step of measuring a emission intensity of the plasma in the chamber through the above window for plasma, compensating a sensitivity with which the emission intensity in performing the plasma processing is measured such that the emission intensity has a constant initial value, and performing process control with respect to the plasma processing based on a variation in the compensated emission intensity, while the above processing is performed.

By the method, the initial value of the emission intensity in each lot when plasma processing is initiated is adjusted to be the same, so that process control is performed based on the time at which the emission intensity having changed reaches a given value. Consequently, simple and prompt control can be performed.

At a time when a gain in compensating the sensitivity with which the emission intensity is measured surpasses a given value in the above third step, it can be judged that maintenance should be performed in the chamber.

By the method, maintenance for removing the deposit from the chamber can be performed before process control for plasma processing encounters any trouble.

At an earlier time when a gain in compensating the sensitivity with which the emission intensity is measured surpasses a given value in the above third step or when the amount of absorption of the above electromagnetic wave by the above deposit surpasses a given value, it can be judged that maintenance should be performed in the chamber.

By the method, it becomes possible to perform maintenance before the process control for plasma processing encounters any trouble or particles are mixed in a material to be processed with a plasma, so that the reliability of the process control for plasma processing can be improved, while the maintenance cycle is maximumly extended.

The plasma processing performed in the above third step can be dry etching and a combination between the above material to be processed and processing gas can produce a polymer of at least either one of carbon and silicon and a halogen element.

By the method, plasma processing can be performed while the state of the deposit produced in the dry etching of a polysilicon film and a silicon dioxide film using a $CH_4$ gas, $CHF_3$ gas, or the like is monitored. When the polysilicon film is subjected to dry etching, for example, etching gas such as HBr gas or $Cl_2$ gas is typically used. During dry etching using such gas, an active species of Br or Cl generated by the plasma is attached on Si atoms on the surface of the material being processed. At the same time, Cl ions and the like formed in the plasma enter the material being processed and the kinetic energy thereof is converted to thermal energy, resulting in reactive ion etching (RIE) for promoting chemical reactions. During the process, if a reaction occurs between Si and Br, e.g., SiBrx (x=1 to 4) is generated. If a reaction occurs between C ejected from the sputtered resist film and Br, a compound containing C and Br is generated. The resulting SiBrx or compound containing C and Br returns to the plasma region and diffuses over the interior wall of the chamber, so that a polymer obtained through the polymerization of the compounds is attached on the interior wall of the chamber to form a deposit. Consequently, the state of the deposit produced during dry etching can be monitored reliably.

To attain the above third object, the present invention provides a method of dry-cleaning a chamber having a window for electromagnetic wave permitting at least any one of electromagnetic waves including a light beam, an X-ray beam, and an electron beam to pass therethrough, the above method comprising: a first step of introducing cleaning gas into the above chamber; a second step of removing a deposit on an interior wall of the above chamber with the above cleaning gas; and a third step of monitoring, while performing the above second step, a state of the above deposit by introducing the above electromagnetic wave into the above chamber from an outside thereof through the above window for electromagnetic wave, ejecting the electromagnetic wave passing through the above deposit from the above chamber to the outside thereof, and measuring an amount of absorption of the ejected electromagnetic wave by the above deposit, wherein when the amount of absorption of the electromagnetic wave by the above deposit measured in the above third step becomes a given value or lower, the above second step is completed.

By the method, even when the deposit attached on the interior wall of the chamber during plasma processing is removed using cleaning gas, the amount of the remaining deposit varying with time can be recognized, while the cleaning atmosphere is held in the chamber. Consequently, it becomes possible to judge the proper timing of completing the cleaning process, so that the problem of performing overcleaning or undercleaning can be prevented.

To attain the above fourth object, a semiconductor manufacturing apparatus according to the present invention comprises: a chamber; a window for electromagnetic wave provided in a part of the above chamber and permitting at least any one of electromagnetic waves including a light beam, an X-ray beam, and an electron beam to pass therethrough; electromagnetic-wave generating means for generating the above electromagnetic wave; electromagnetic-wave measuring means for measuring absorption of the electromagnetic wave by a deposit in the above chamber after the electromagnetic wave passes through the deposit; and transmission-path adjusting means for adjusting a transmission path of the electromagnetic wave such that the electromagnetic wave generated from the above electromagnetic-wave generating means is directed to the above deposit through the above window for electromagnetic wave and ejected from the chamber to an outside thereof after passing through the deposit to reach the above electromagnetic-wave measuring means.

With the arrangement, the electromagnetic wave reaching the electromagnetic-wave measuring means exhibits a characteristic varied from that of the electromagnetic wave before entering the deposit due to the interaction with the deposit. Consequently, the state of the deposit can be recognized accurately through comparison between the characteristics of the electromagnetic wave before and after passing through the deposit. When the semiconductor manufacturing apparatus is used for CVD, plasma CVD, dry etching, or the like, information on the deposit can be used for process control and maintenance by monitoring the deposit in the chamber.

The semiconductor manufacturing apparatus can be constructed such that a part of the above chamber is provided with a cylindrical monitoring member composed of a protruding portion of a wall surface constituting the chamber and closed at its tip; that the above window for electromagnetic wave includes first and second windows for electromagnetic wave provided at two opposing positions of a side of the above cylindrical monitoring member; and that the above transmission-path adjusting means introduces the electromagnetic wave into the cylindrical monitoring member through the above first window for electromagnetic wave and ejects the electromagnetic wave passing through and reflected from the deposit on an inner surface of the tip from the above cylindrical monitoring member to an outside thereof through the above second window for electromagnetic wave such that the electromagnetic wave reaches the above electromagnetic-wave measuring means.

With the arrangement, the electromagnetic wave entering the deposit attached on the interior wall of the tip of the monitoring member is partly absorbed thereby due to the interaction with the deposit and then reaches the electromagnetic-wave measuring means without passing through the plasma region in the chamber. The sensitivity with which the absorption of the electromagnetic wave by the deposit is measured is improved accordingly since the electromagnetic wave is not absorbed in the plasma region. Moreover, the area occupied by the apparatus is reduced and the adjustment of the transmission path is greatly facilitated since the electromagnetic-wave generating means, electromagnetic-wave measuring means, and transmission-path adjusting means are collectively provided on the side of the chamber provided with the monitoring member.

The above cylindrical monitoring member may be detachably constructed at one portion thereof.

With the arrangement, it becomes possible to perform maintenance by partly detaching the monitoring member essential for monitoring the state of the deposit, so that an improved sensitivity of measurement is maintained.

Another semiconductor manufacturing apparatus comprises: a chamber; plasma generating means for ionizing gas introduced into the above chamber with an RF electric field to generate a plasma; a window for plasma provided in the above chamber and permitting light emitted from the plasma in the chamber to pass therethrough; emission-intensity measuring means for measuring a emission intensity of the plasma in the chamber through the above window for plasma; and process control means for receiving an output from the above emission-intensity measuring means, compensating a sensitivity with which the emission intensity is measured such that the emission intensity in performing plasma processing has a constant initial value, and performing process control with respect to the plasma processing based on a variation in the compensated emission intensity.

With the arrangement, process control including the judgment of the time at which dry etching should be completed can be performed promptly with a simple arrangement by utilizing a variation in the emission intensity of the plasma.

The semiconductor manufacturing apparatus may further comprises: a chamber; a window for electromagnetic wave provided in a part of the above chamber and permitting at least any one of electromagnetic waves including a light beam, an X-ray beam, and an electron beam to pass therethrough; electromagnetic-wave generating means for generating the above electromagnetic wave; electromagnetic-wave measuring means for measuring an amount of absorption of the electromagnetic wave by the above deposit in the above chamber after the electromagnetic wave passes through the deposit; transmission-path adjusting means for adjusting a transmission path of the electromagnetic wave such that the electromagnetic wave generated from the above electromagnetic-wave generating means is directed to the deposit on an inner surface of the above window for electromagnetic wave through the above window for electromagnetic wave and ejected from the chamber to an outside thereof after passing through the deposit to reach the above electromagnetic-wave measuring means; and data transfer means for inputting to the above process control means the amount of absorption of the above electromagnetic wave by the above deposit measured by the above electromagnetic-wave measuring means, wherein the above process control means compensates the sensitivity with which the above emission intensity is measured based on the amount of absorption of the above electromagnetic wave by the above deposit transferred from the above data transfer means.

With the arrangement, during plasma processing using the semiconductor manufacturing apparatus, process control is performed based on the varying thickness of the deposit on the interior wall of the chamber, so that the reliability of control is increased.

DETAILED DESCRIPTION OF THE INVENTION

First Embodiment

Figure 1:
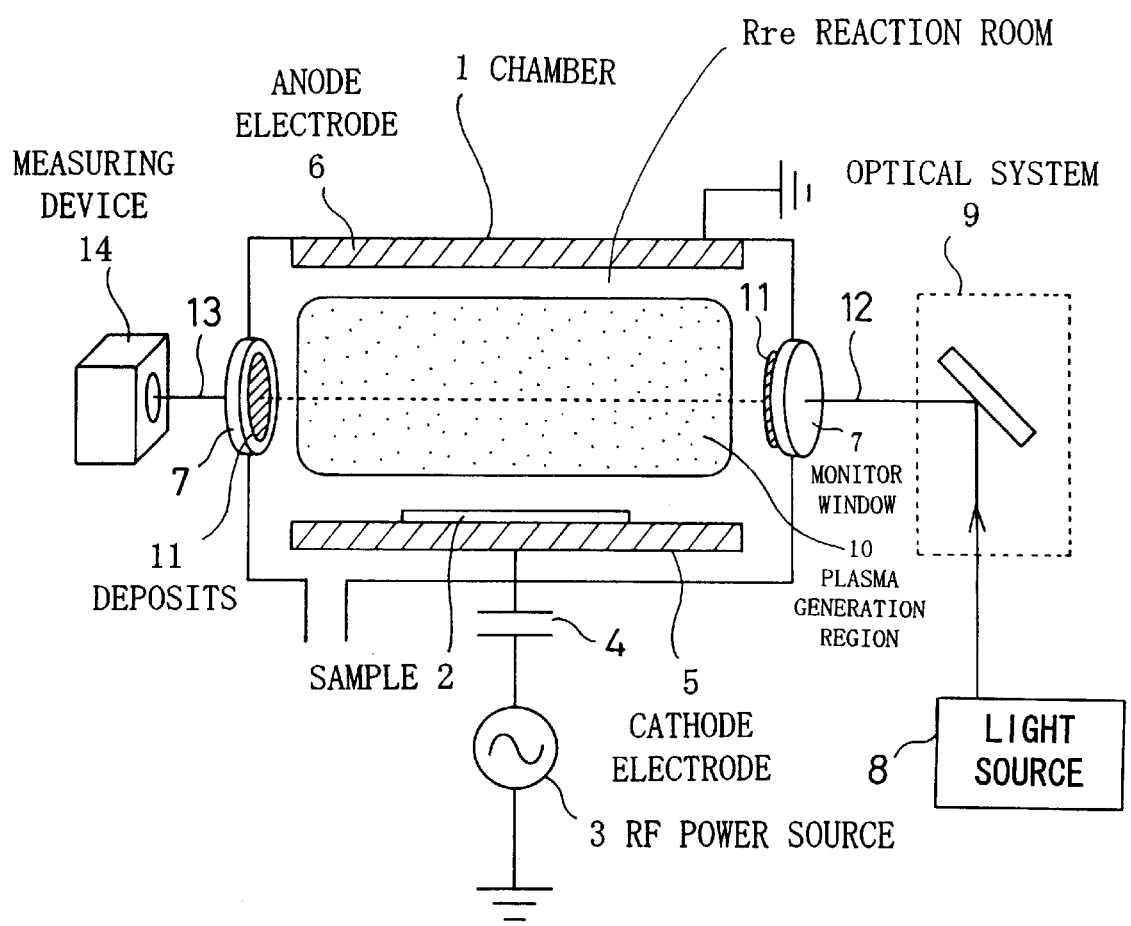
FIG. 1 diagrammatically shows an arrangement of a semiconductor manufacturing apparatus according to a first embodiment.

Initially, a first embodiment will be described. FIG. 1 is a vertical cross-sectional view showing an arrangement of a dry-etching apparatus according to the first embodiment, in which are shown: an elevation-type cylindrical chamber 1; a sample 2 as a material to be processed, such as a semiconductor wafer for LSI with a polysilicon film deposited thereon; an RF power source 3 (such as an industrial power source of 13.56 MHz); a coupling capacitor 4; a cathode electrode 5 also serving as a sample holder; an anode electrode 6; monitor windows 7 composed of quartz plates provided at two opposing positions in the side of the chamber 1; a light source 8 for monitoring which generates an infrared ray; and an optical system 9 for transmitting the infrared ray from the light source 8. The closed space defined by the above chamber 1 forms a reaction room Rre. There are also shown: a plasma generation region 10 formed in the reaction room Rre; deposits 11 formed of an etching by-product deposited on the inner surfaces of the monitor windows 7; an incoming infrared ray 12 introduced into the chamber 1 via the optical system 8; an outgoing infrared ray 13 which is the incoming infrared ray 12 ejected from the chamber 1 after passing through the deposits 11; and a measuring device 14 for measuring the intensity of the outgoing infrared ray 13 and the spectrum thereof. As shown in the drawing, the optical system 9 is designed so that the infrared ray follows a transmission path by entering the chamber 1 from one of the monitor windows 7, passing through the deposits 11, going out of the chamber 1, and reaching the measuring device 14. In the arrangement, the above optical system 9 functions as transmission-path adjusting means. The light source 8 functions as electromagnetic-wave generating means, while the measuring device 14 functions as electromagnetic-wave measuring means. The RF power source 3, the coupling capacitor 4, and the electrodes 5 and 6 constitute plasma generating means.

Next, descriptions will be given to a dry-etching method and to a method of monitoring the film thickness of the deposit. Initially, HBr gas and $Cl_2$ gas as etching gas is introduced into the chamber 1 and subjected to discharging under a pressure of 100 mTorr, thereby forming the plasma generation region 10 in the chamber 1. The power applied in the step is 200 W. The plasma generation region 10 is thus formed and an active species serving as an etchant is directed to the polysilicon film of the sample 2. Through the reaction between the active species and a material on the surface of the sample 2, the etching by-product or the deposit 11 is formed, which is a compound mainly composed of Si and Br. The compound is partly discharged from the chamber 1, while the remaining portion thereof is deposited on the interior wall of the chamber 1 and on the monitor windows 7. In the initial state where no etching is performed yet, the incoming infrared ray 12 passes through the window 7 without being attenuated, so that the spectrum of the outgoing infrared ray 13 measured by the measuring device 14 is substantially the same as that of the incoming infrared ray 12.

Figure 2A:
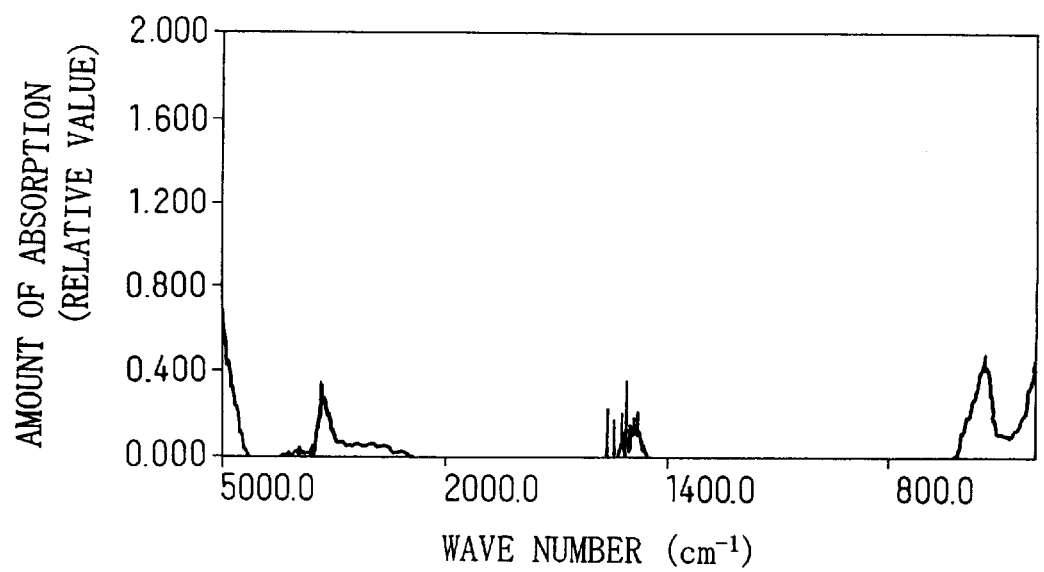
FIG. 2(a) shows an infrared absorption spectrum initially measured in the first embodiment and FIG. 2(b) shows an infrared absorption spectrum measured after 1000 wafers were sequentially processed in the first embodiment.
Figure 2B:
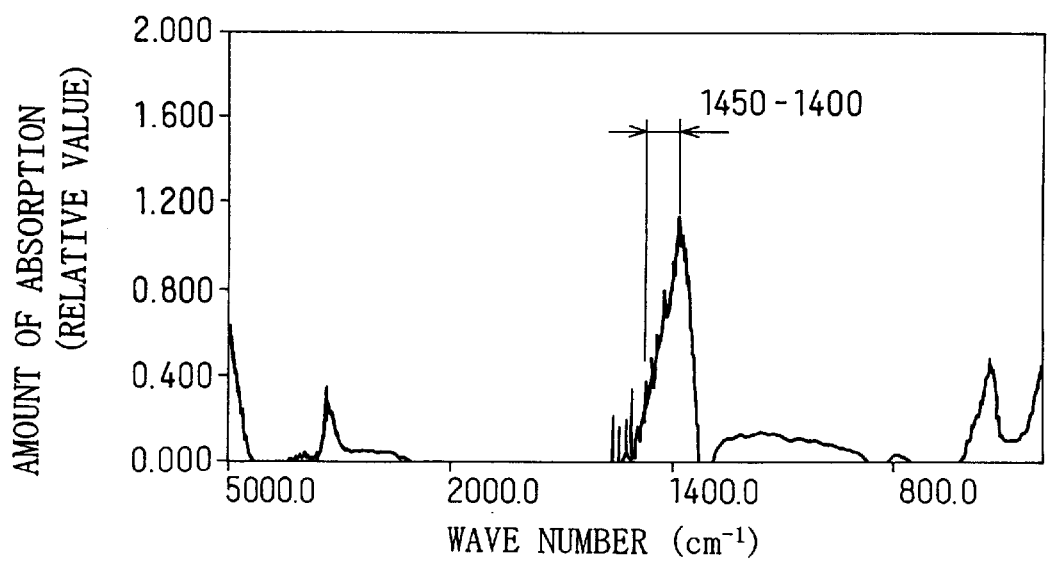

On the other hand, the film thickness of the deposit 11 formed on the window 7 increases with an increase in the number of processed wafers or with an increase in the number of etching processes performed. As a result, the spectrum of the incoming infrared ray 12 changes when it passes through the window 7. Specifically, energy transmission occurs from photons to Si—Br bonds present in the compound of Si and Br forming the deposit 11 and the intensity of the incoming infrared ray 12 is consequently lowered in the corresponding range, so that the monitored spectrum exhibits characteristics different from those of the spectrum of the incoming infrared ray. The characteristics of the two spectra are shown in FIGS. 2(a) and 2(b), respectively. FIG. 2(a) shows the initial absorption spectrum of the outgoing infrared ray 13 measured before etching is initiated in the chamber 1 and FIG. 2(b) shows the absorption spectrum of the outgoing infrared ray 13 measured after 1000 wafers were processed. As shown in FIG. 2(b), the absorption of light is observed in the range of wave numbers of 1450 to 1400 $cm^{-1}$.

Figure 3A:
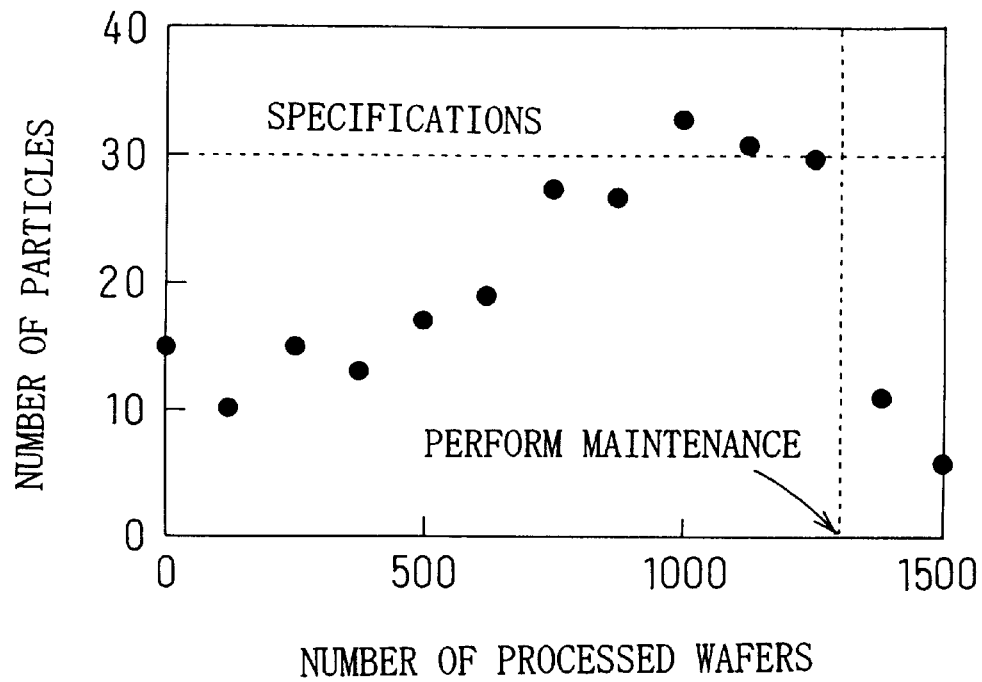
FIG. 3(a) is a graph showing variations in the number of particles and FIG. 3(b) is a graph showing variations in the rate of etching polysilicon, each accompanying increases in the number of processed wafers in the first embodiment.
Figure 3B:
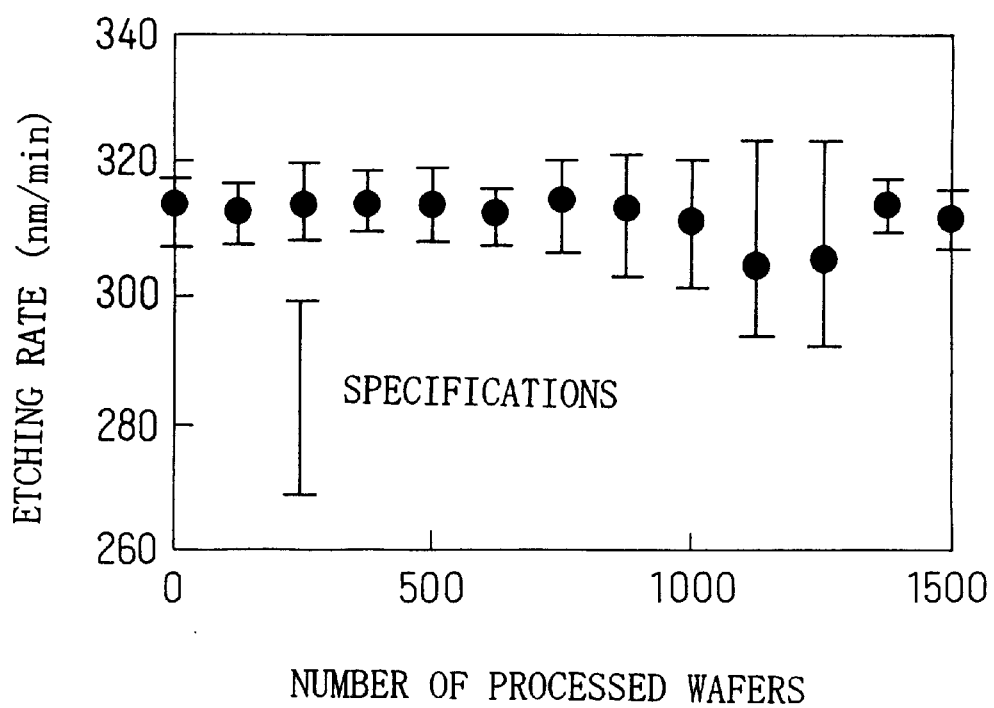

FIG. 3(a) shows variations in the number of counted particles in the chamber 1. The number was counted for particles each having a diameter of 0.3 μm or more by utilizing the scattering of a laser beam. FIG. 3(b) shows the mean values of the rate of etching the polysilicon film and the fluctuations thereof. In the drawing, the solid circles indicate the mean values of the etching rate and the ranges of the vertical lines indicate the fluctuations thereof. The measurements were performed at nine points on the surface of a wafer. As shown in FIG. 3(b), the number of counted particles as well as the fluctuations of the etching rate increase with increases in the number of processed wafers. After about 1000 wafers were processed, the number of counted particles surpasses a tolerable value of 30 within specifications, while the fluctuation range of the etching rate surpasses ±5% within specifications. At this point, the total amount of absorption of the infrared ray by the deposit is substantially doubled.

Thereafter, the number of counted particles stays outside specifications and maintenance is performed when the amount of absorption exceeds double the initial value (when about 1300 wafers were processed). Consequently, as shown in FIGS. 3(a) and 3(b), the number of counted particles is reduced to about 10 and the fluctuation range of the etching rate is reduced to ±3%. On the other hand, the characteristics of the absorption spectrum being monitored are restored to the initial level (on the order shown in FIG. 2(a)) and hence the total amount of absorption is restored to the initial value. Maintenance is performed afterwards every time the total amount of absorption becomes double the initial value, with the result that the number of counted particles exhibits the transition up to 1000 wafers shown in FIG. 3(a), which indicates that the number of counted particles is constantly within specifications. The fluctuation range of the etching rate, which is one of etching characteristics, is also reduced to ±5%, so that the availability of the apparatus has been maximized.

Thus, by monitoring the deposits 11 on the windows 7 during dry etching with the use of the infrared ray, etching characteristics can be held constant under control, thereby improving availability and production yield.

Second Embodiment

Figure 4:
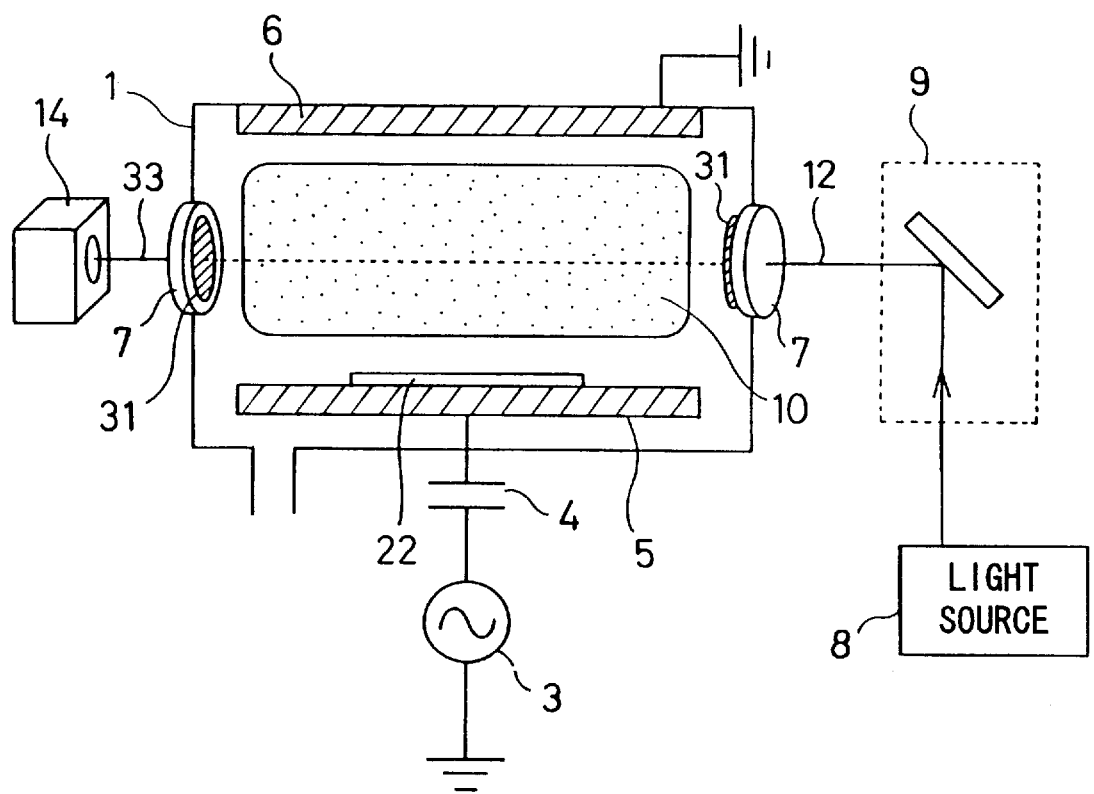
FIG. 4 is a vertical cross-sectional view diagrammatically showing an arrangement of a semiconductor manufacturing apparatus according to a second embodiment.

Next, a second embodiment will be described. FIG. 4 is a vertical cross-sectional view showing an arrangement of a dry-etching apparatus according to the second embodiment. In the drawing, like reference numerals used in FIG. 1 designate like components. For example, a reference numeral 22 designates a sample as the material to be processed, such as a semiconductor wafer for LSI with a silicon dioxide film deposited thereon, while a reference numeral 31 designates the deposits composed of an etching by-product. As shown in the drawing, the dry-etching apparatus according to the present embodiment has basically the same construction as the dry-etching apparatus according to the first embodiment.

Below, a description will be given to a method of dry etching according to the present embodiment. First, a mixture of $CF_4$ gas, $CHF_3$ gas, and Ar gas as the etching gas is introduced into the chamber 1 and subjected to discharging under a pressure of 60 mTorr. The power applied in the step is 400 W. The plasma generation region 10 is thus formed and an active species serving as an etchant is directed to the silicon dioxide film of the sample 22. The etching by-product formed through the reaction is a compound mainly composed of Si and C. The compound is partly discharged from the chamber 1, while the remaining portion thereof is attached on the interior wall of the chamber 1 and on the monitor windows 7 as the deposits 31. In the initial state (where no processing is performed yet), the intensity of the outgoing infrared ray 13 is hardly attenuated upon passing through the window 7, so that the characteristics of the absorption spectrum thereof are substantially the same as the characteristics of the spectrum of the incoming infrared ray 12.

Figure 5A:
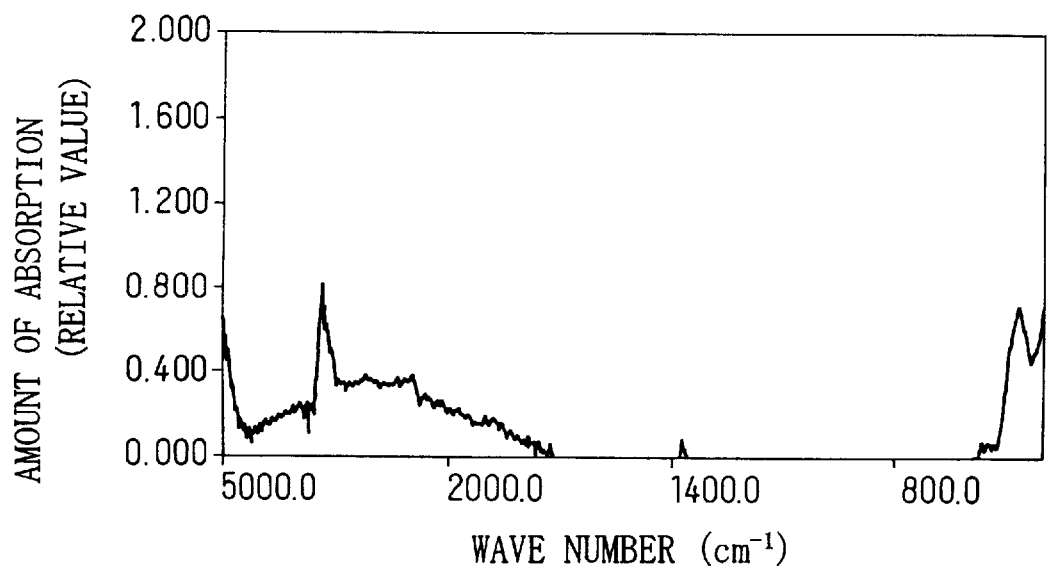
FIG. 5(a) shows an infrared absorption spectrum initially measured in the second embodiment and FIG. 5(b) shows an infrared absorption spectrum measured after 1000 wafers were sequentially processed in the second embodiment.
Figure 5B:
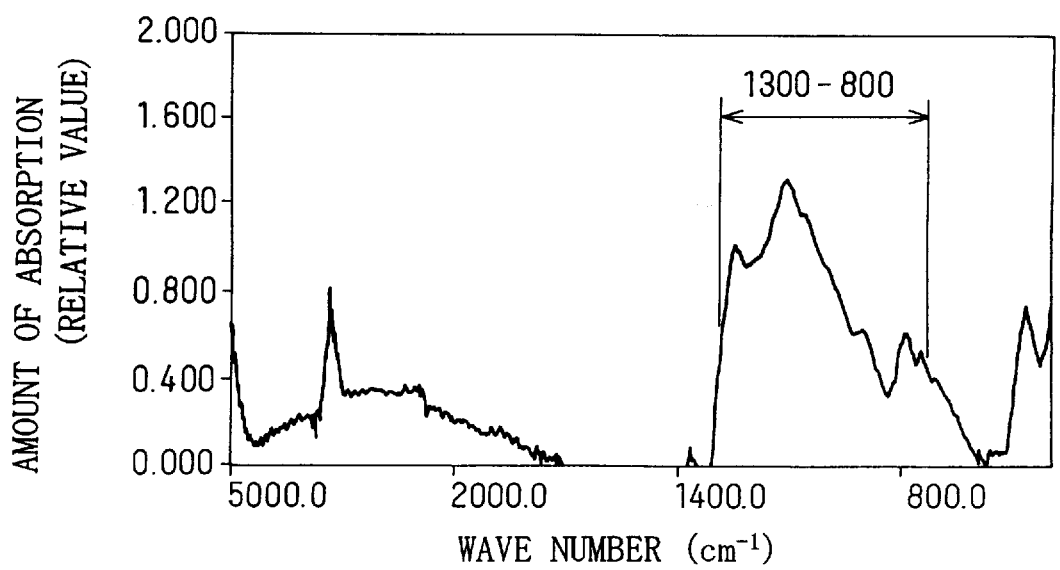

However, the film thickness of the deposit 31 attached on the window 7 increases with increases in the number of processed wafers. As a result, the characteristics of the spectrum of the incoming infrared ray 12 change upon passing through the window 7. Specifically, energy transmission occurs to Si—C bonds present in the compound of Si and C or to C—F bonds present in the compound of C and F each composing the deposit 31 and the intensity of the infrared ray is consequently lowered in the corresponding range, which causes a change in the characteristics of the spectrum of the outgoing infrared ray 33 being monitored. The characteristics of the spectrum are shown in FIGS. 5(a) and 5(b). FIG. 5(a) shows the initial absorption spectrum of the outgoing infrared ray 33 measured before etching is initiated in the reaction room Rre and FIG. 5(b) shows the absorption spectrum of the outgoing infrared ray 33 measured after 1000 wafers were processed. As shown in FIG. 5(b), the absorption of light is observed in the range of wave numbers of 1300 to 800 $cm^{-1}$.

Thus, by detecting variations in the number of counted particles and in etching rate in accordance with the same method as used in the first embodiment and then performing maintenance when the total amount of absorption becomes approximately double the initial value (when about 1500 wafers were processed), the number of counted particles can be reduced from a value over specifications (50) to about 22. Moreover, the fluctuation range of $SiO_2$/Si selectivity, which is an important etching characteristic in the etching of a silicon dioxide film, can be reduced from ±12% outside specifications to ±10% (actually ±7%). In addition, the total amount of absorption can be restored to the initial value (FIG. 5(a)). Furthermore, by performing maintenance afterwards every time the total amount of absorption of the infrared ray becomes double the initial value, the number of counted particles remains within specifications and the fluctuation range of the $SiO_2$/Si selectivity, which is one of the etching characteristics, is reduced to ±10%. Consequently, the etching characteristics can be held constant under control, thereby improving availability and production yield.

Third Embodiment

Figure 6A:
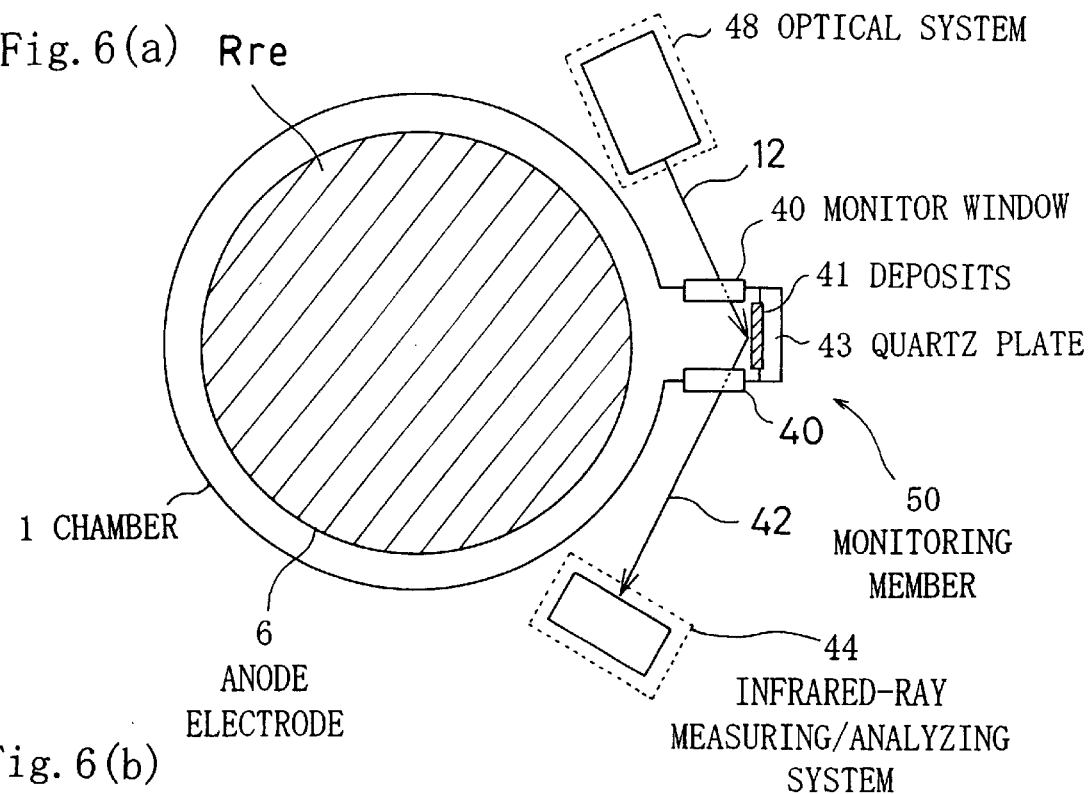
FIGS. 6(a) and 6(b) are transverse and vertical cross-sectional views each diagrammatically showing an arrangement of a semiconductor manufacturing apparatus according to a third embodiment.
Figure 6B:
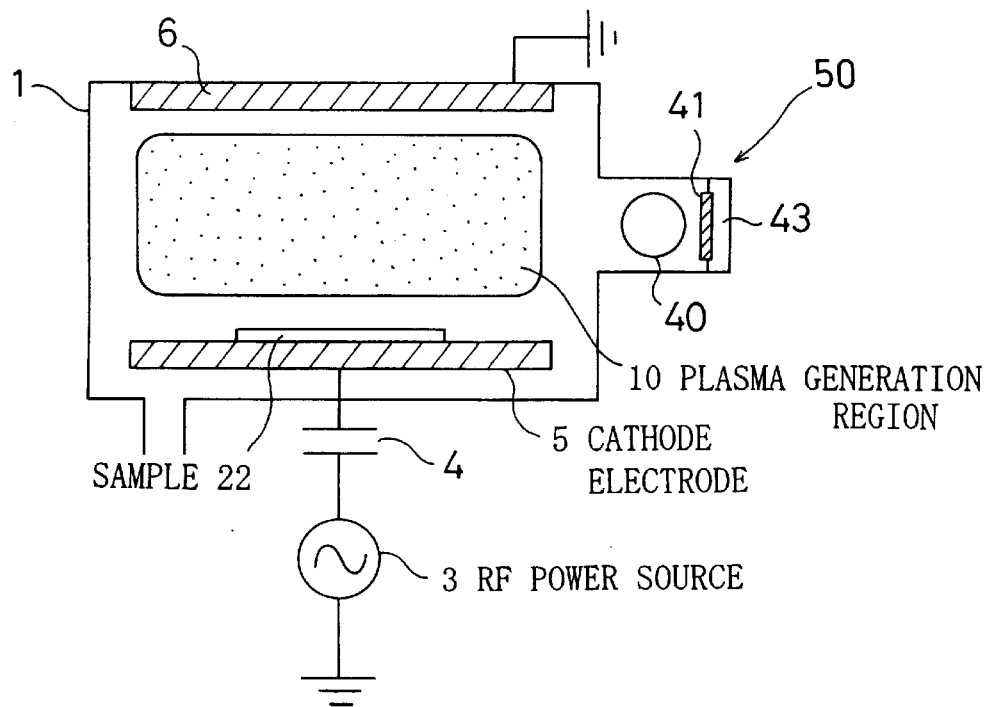

Next, a third embodiment will be described. FIGS. 6(a) and 6(b) are transverse and vertical cross-sectional views showing an arrangement of a dry-etching apparatus according to the third embodiment, wherein like reference numerals used in FIG. 1 designate like components. The present embodiment is characterized by a monitoring member 50 in the form of a smaller cylinder with a closed bottom protruding from a casing in the form of a larger cylinder composing the chamber 1. The tip of the monitoring member 50 in the form of a smaller cylinder is provided with a detachable quartz plate 43. The monitoring member 50 are provided with respective windows 40 made of a material which permits the passage of an infrared ray and located at two opposing positions of the smaller cylinder. In the drawing, a reference numeral 41 designates a deposit composed of an etching by-product, 42 designates an outgoing infrared ray passing through the deposit 41, 44 designates an infrared-ray measuring/analyzing system, and 48 designates an infrared light source and optical system. The incoming infrared ray 12 supplied from the optical system 48 is directed to the deposit 41 through one of the windows 40 to interact with the deposit 41 and is thereby reflected, resulting in the outgoing infrared ray 42 emitted from the chamber 1 through the other of the windows 40 to reach the infrared-ray measuring/analyzing system 44. In short, the optical system 48 is so constituted that the infrared ray does not pass through the plasma generation region 10.

In the present embodiment, if etching is performed through the same process as described in the first embodiment, the components of the deposit such as SiBrx produced during etching diffuse from the plasma generation region 10 toward the periphery to eventually reach the quartz plate 43. When the absorption spectrum of the outgoing infrared ray 42 passing through the deposit 41 is monitored, similarly to each of the above embodiments, the sensitivity with which the absorption spectrum of the infrared ray is measured is improved in the present embodiment, since no interaction is observed between the infrared ray and the plasma. Since the material to be etched is the silicon dioxide film in the present embodiment, similarly to the above second embodiment, the initial absorption spectrum and the absorption spectrum measured after the chamber was used for dry etching exhibit basically the same characteristics as shown in FIGS. 5(*a*) and 5(*b*). However, the S/N ratio of a signal to noise in the absorption spectrum is substantially doubled. Moreover, since the system for monitoring the infrared ray does not spatially interfere with the main body of the chamber as shown in FIGS. 6(*a*) and 6(*b*), the time conventionally required to adjust the infrared-ray optical path can be reduced to about ⅓. Furthermore, by monitoring the environment in the reaction room based on the characteristics of absorption of the infrared ray, the etching characteristics can be held constant under control, thereby improving availability and production yield.

Fourth Embodiment

Next, a fourth embodiment associated with chamber cleaning will be described. In the present embodiment, the deposit attached on the interior wall of the chamber 1 in the etching apparatus shown in FIGS. 6(*a*) and 6(*b*) is removed in accordance with the following method.

Figure 7:
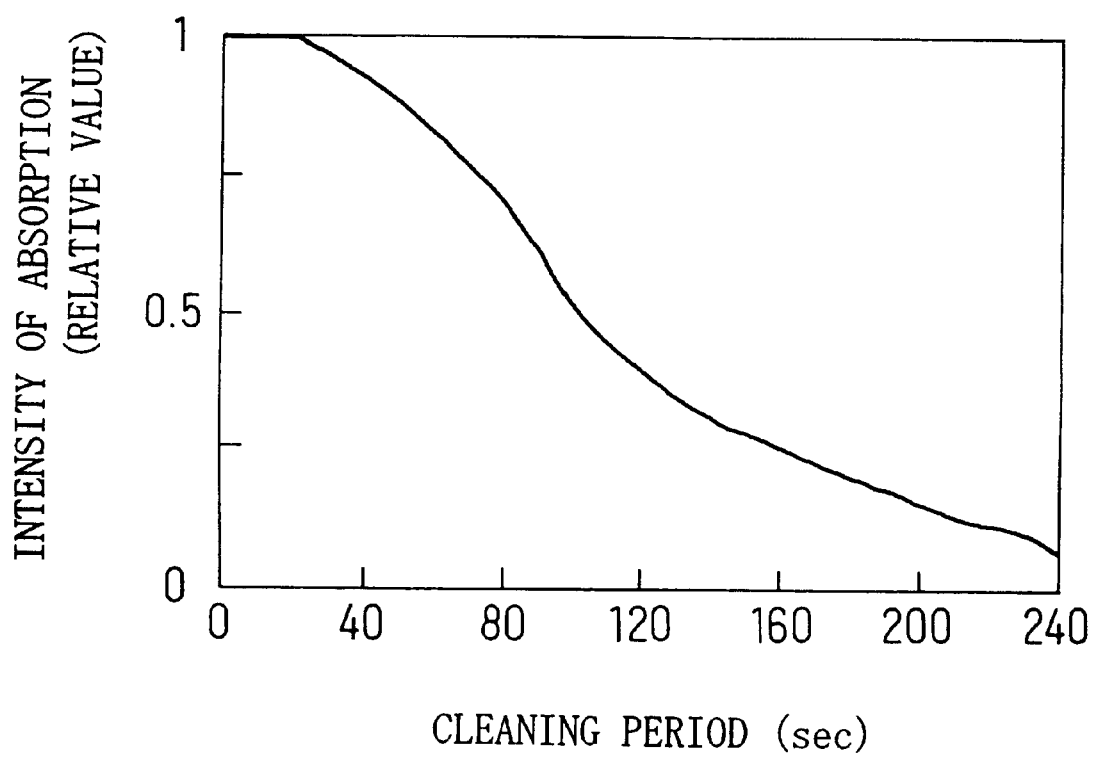
FIG. 7 is a graph showing the relative intensity of absorption of an infrared ray which varies with time during the implementation of a cleaning method in a fourth embodiment.

In the process of performing etching in accordance with the procedures as shown in the above first embodiment, the interior wall of the reaction room is subjected to dry cleaning after 1000 wafers were processed. The etching gas used is $NF_3$ gas, while the pressure in the chamber 1 is 200 mTorr and the power applied is 200 W. Discharging is caused by the application of the power and the intensity of absorption of the infrared ray which varies with time is monitored at 1400 $cm^{-1}$. FIG. 7 shows the characteristics of the variations. As shown in the drawing, the intensity of absorption of the infrared ray, i.e., the total amount of deposit decreases as the processing period or cleaning period elapses. When about 160 seconds has elapsed after the initiation of cleaning, the relative intensity of absorption is reduced to ¼. After cleaning is performed for about 240 hours, the number of particles on a wafer for monitoring is counted. According to the result of the counting, the number of counted particles is reduced from a value over specifications (30) to about 11, which indicates that the deposit has been removed. Therefore, it is judged that the cleaning should be completed when the amount of absorption becomes a given value or lower. By the method, the deposit can be removed reliably and the cleaning method can be implemented properly, while the cleaning period is optimumly determined.

Fifth Embodiment

Figure 8:
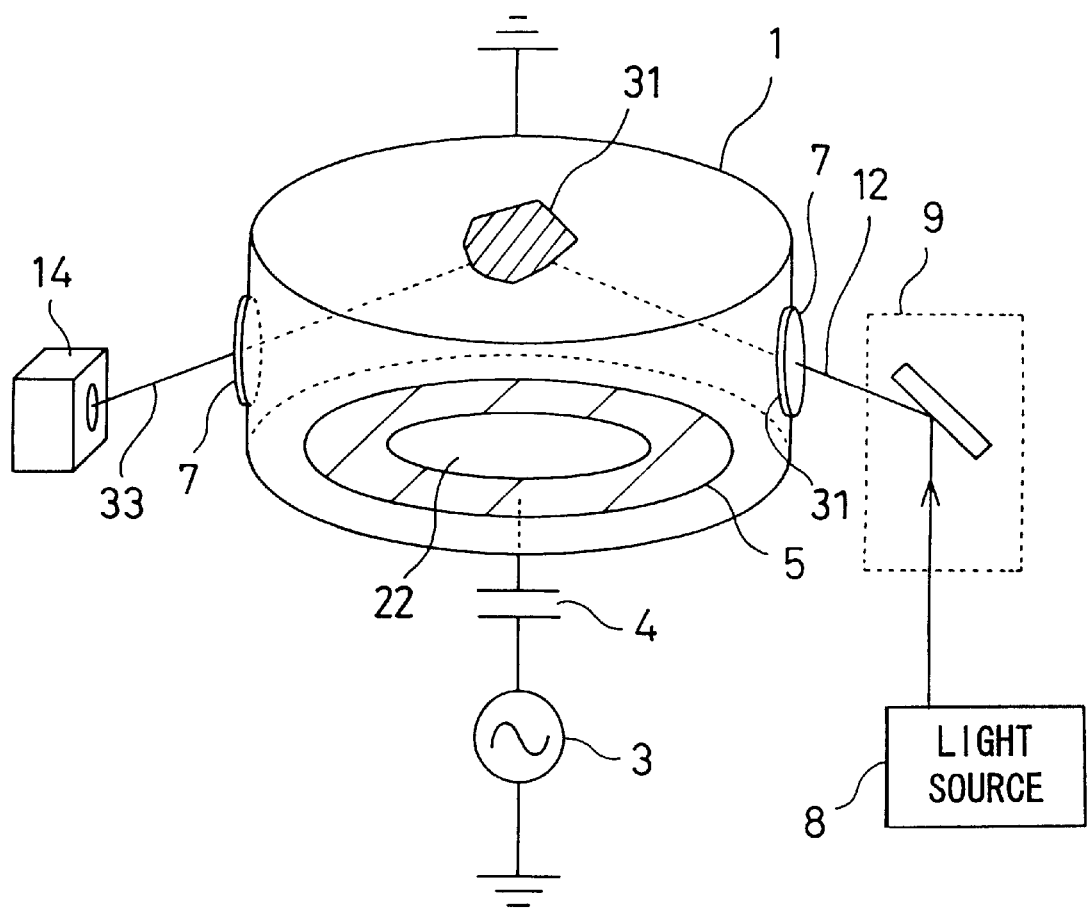
FIG. 8 is a perspective view transparently showing the inside of a semiconductor manufacturing apparatus according to a fifth embodiment.

Next, a fifth embodiment will be described. In the present embodiment, an infrared ray is introduced through one of windows 7 so that the absorption spectrum of the infrared ray reflected by a deposit 3 attached on the interior wall of a chamber 1 is measured. Specifically, as shown in FIG. 8, the absorption spectrum of an outgoing infrared ray 33 passing through the deposits 31 at three positions is measured by a measuring device 14. In the present embodiment also, information on the environment in the chamber can be obtained similarly to each of the above embodiments, so that excellent etching characteristics, the optimum maintenance cycle, and an improved availability of the apparatus are implemented. In particular, since the present embodiment measures the absorption of the infrared ray passing through the deposits at the three positions, which are the two windows and the interior wall of the main body of the chamber 1, the accuracy of measurement is improved. Additionally, it becomes possible to monitor the deposit at an arbitrary position of the interior wall of the chamber 1, so that the environment in the chamber 1 can be recognized more positively.

Sixth Embodiment

Next, a sixth embodiment will be described with reference to FIGS. 10(*a*) and (*b*), FIG. 11, and FIG. 12.

Figure 10:
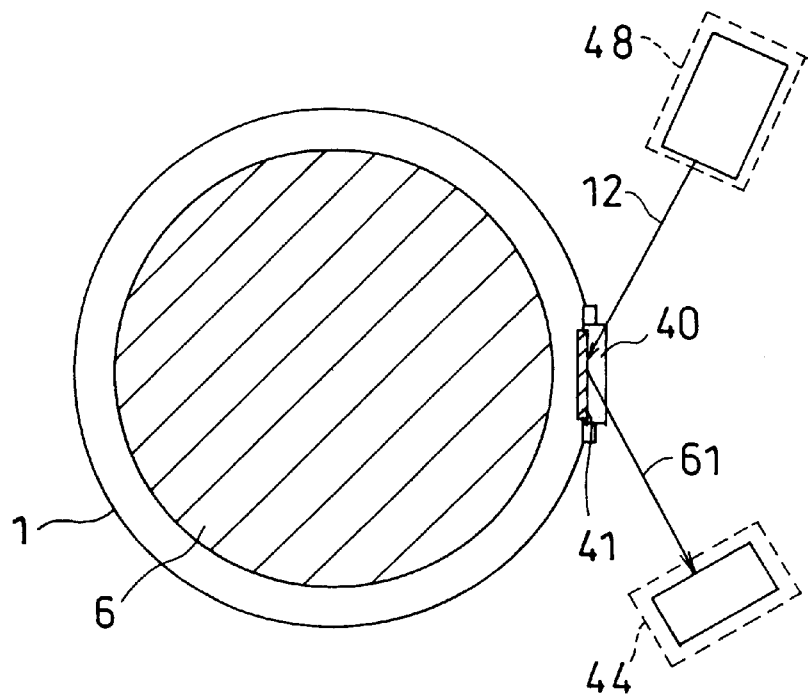
FIGS. 10(a) and 10(b) are transverse and vertical cross-sectional views of a semiconductor manufacturing apparatus according to a sixth embodiment.
Figure 10:
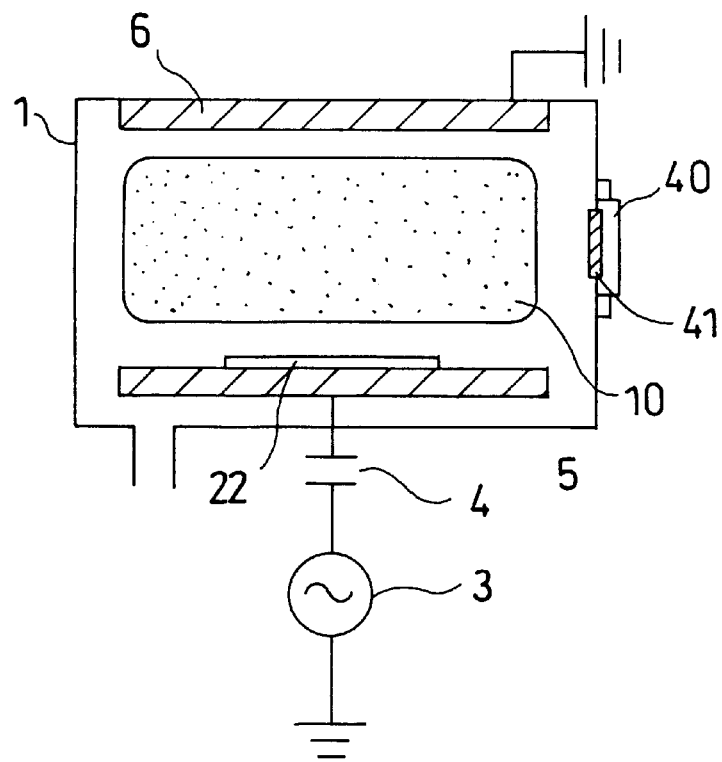

FIGS. 10(*a*) and 10(*b*) are transverse and vertical cross-sectional views of a dry-etching apparatus according to the present embodiment. As shown in the drawings, the construction of the dry-etching apparatus according to the present embodiment is substantially the same as the dry-etching apparatus according to the above third embodiment shown in FIGS. 6(*a*) and (*b*), except for a portion for monitoring the deposit. In the present embodiment, only one window 40 made of a single quartz plate is provided on the side wall of the chamber 1 so that the infrared ray is directed to and reflected from the inner surface of the window 40 by the infrared light source and optical system 48 to reach the infrared-ray measuring/analyzing system 44. In the arrangement also, the infrared ray does not pass through the plasma generation region 10.

In the present embodiment, dry etching is performed under the same conditions used in the above second embodiment. Into the chamber 1, a mixture of $CF_4$ gas, $CHF_3$ gas, and Ar gas as etching gas is introduced and subjected to discharging under a pressure of 60 mTorr. The power applied in the step is 400 W. The plasma generation region 10 is thus formed and an active species functioning as an etchant is directed to the silicon dioxide film of the sample 22. The etching by-product formed through the reaction is a compound mainly composed of Si and C. The compound is partly discharged from the chamber 1, while the remaining portion thereof is deposited on the interior wall of the chamber 1 and on the inner surface of the monitor window 40.

Figure 11:
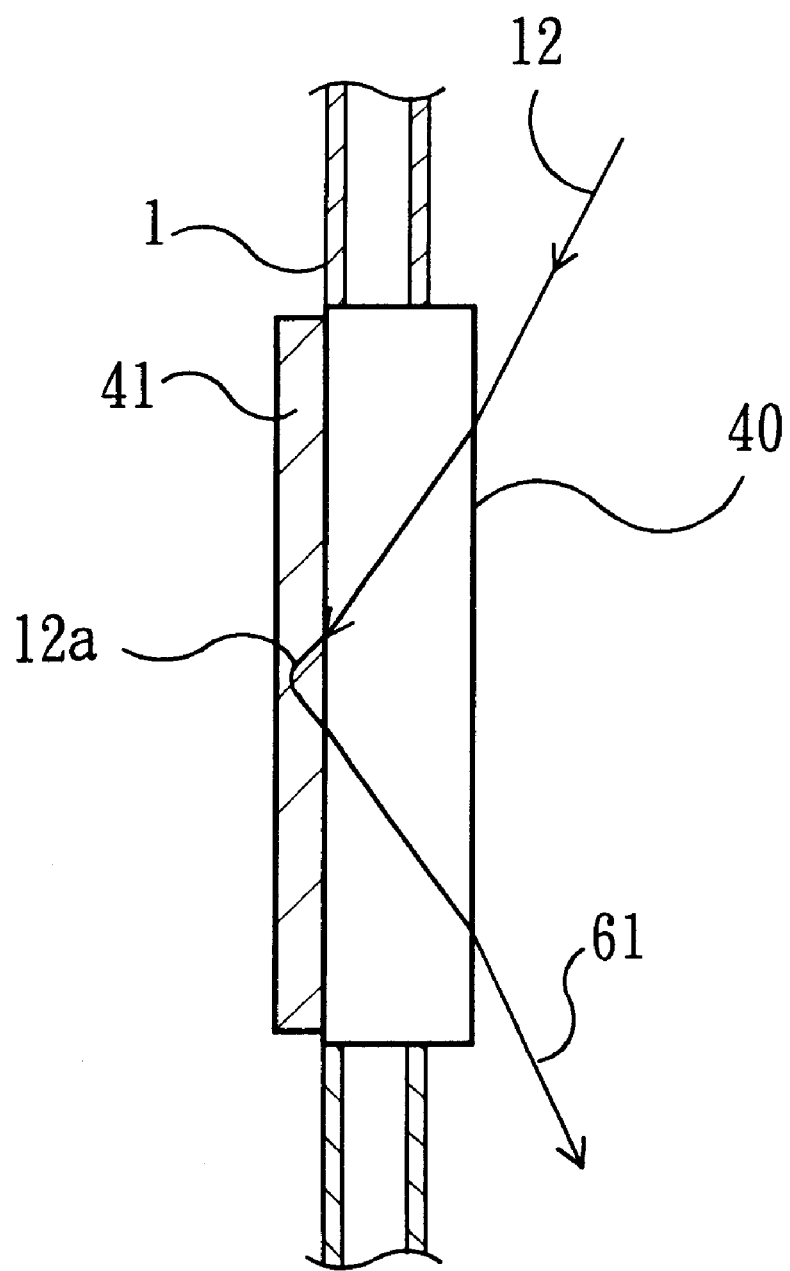
FIG. 11 is a transverse cross-sectional view showing the infrared ray totally reflected by the inner surface of a window when the deposit is monitored in the sixth embodiment.

FIG. 11 is a transverse cross-sectional view showing in detail an infrared-ray transmission path. The incoming infrared ray- 12 entering the window 40 from the outside thereof is totally reflected by the inner surface of the window 40. In general, the phenomenon that an evanescent wave seeps into a second medium when an electromagnetic wave travelling through a first medium is totally reflected by the interface between the first and second media is known as a fundamental property of the electromagnetic wave including light. Specifically, the evanescent wave 12*a* in the incoming infrared ray 12 seeps into the deposit 41 so that it is absorbed thereby and totally reflected. Consequently, the outgoing infrared ray 61 is absorbed in accordance with the film thickness of the deposit 41, so that the wavelength of the absorption spectrum of the infrared ray and the amount of absorption can be measured by the same method as used in the first embodiment. Briefly, by measuring the amount of absorption of the outgoing infrared ray 61 especially at a wave number of $1400^{-1}$ based on the initial absorption spectrum and on the absorption spectrum measured after some wafers were processed as shown in FIGS. 2(a) and 2(b), the type and film thickness of the deposit 41 can be detected.

Figure 12:
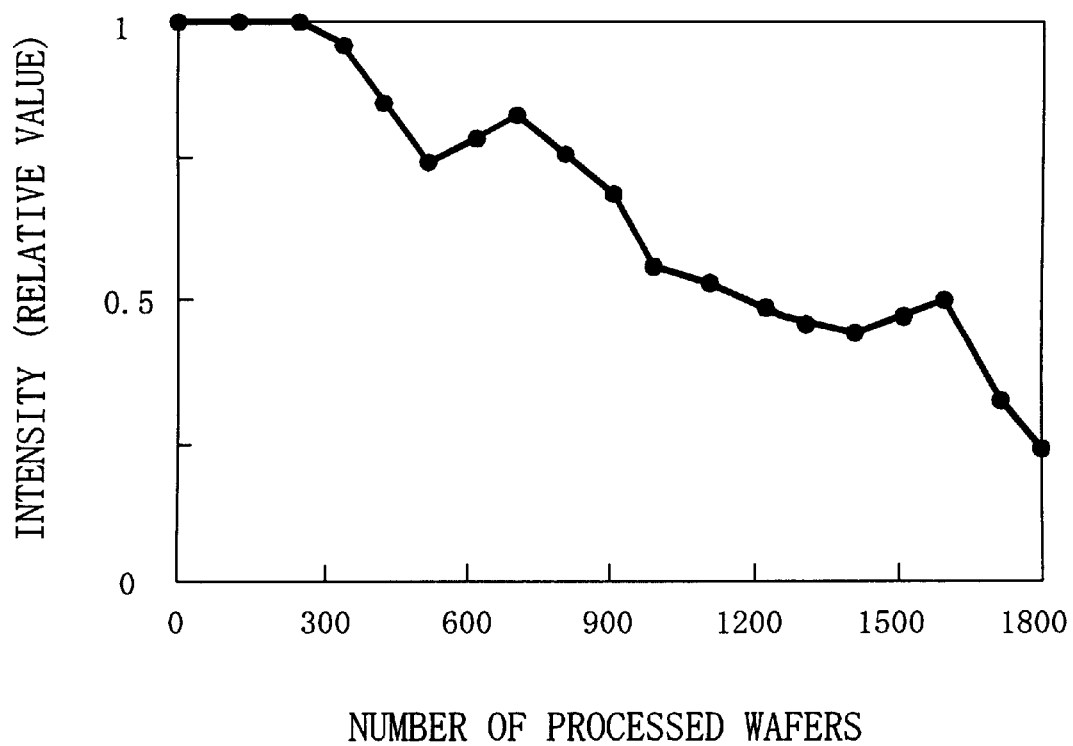
FIG. 12 shows data on variations in the measured intensity of the infrared ray with respect to the number of processed wafers in the sixth embodiment.

FIG. 12 shows variations in the intensity (relative value) of the outgoing infrared ray 61 with respect to the number of processed wafers. As can be understood from the drawing, the intensity of the passing infrared ray 61 decreases and the film thickness of the deposit 41 increases with increases in the number of processed wafers. The relative intensity in the present embodiment is measured under the same conditions as used in FIGS. 9(a) and 9(b).

Thus, it is sufficient in the present embodiment to use only one monitor window 40 of extremely simple structure, since attention has been focused on the phenomenon that an evanescent wave seeps into a second medium when an electromagnetic wave travelling through a first medium is totally reflected by the interface between the first and second media. Moreover, since the infrared ray does not pass through the plasma generation region 10, the accuracy of measurement is considerably high.

Seventh Embodiment

Next, a seventh embodiment will be described with reference to FIGS. 13(a) and 13(b) and FIG. 14.

Figure 13A:
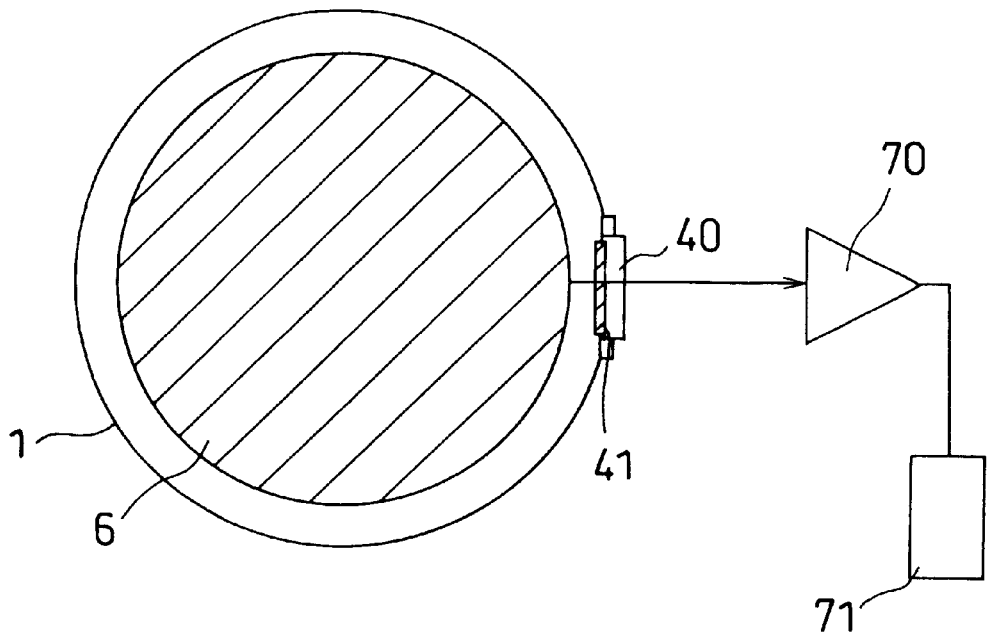
FIGS. 13(a) and 13(b) are transverse and vertical cross-sectional views of a semiconductor manufacturing apparatus according to a seventh embodiment.
Figure 13B:
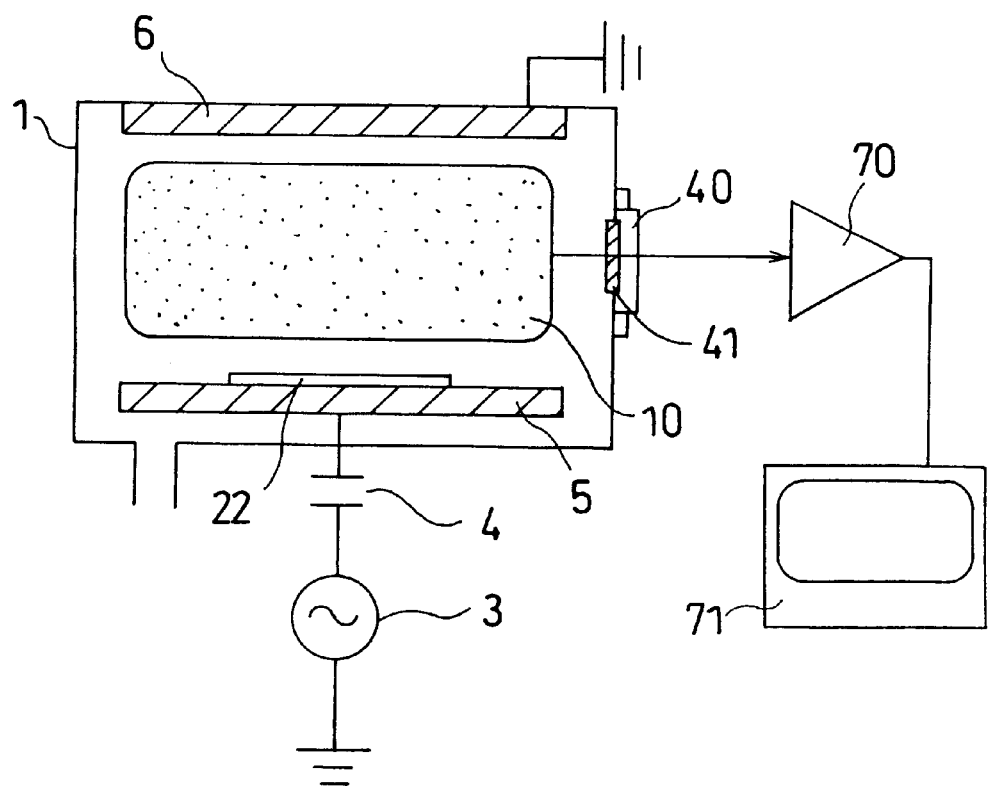

FIGS. 13(a) and 13(b) are transverse and vertical cross-sectional views of a dry-etching apparatus according to the present embodiment. In the drawings, like reference numerals designate like components, which are: an elevation-type cylindrical chamber 1; a sample 22 as the material to be processed, such as a semiconductor wafer for LSI with a polysilicon film deposited thereon; an RF power source 3 (e.g., an industrial power source of 13.56 MHz); a coupling capacitor 4; a cathode electrode 5 also serving as a sample holder; and an anode electrode 6. The closed space defined by the above chamber 1 forms a reaction room Rre. A plasma generation region 10 is formed in the reaction room Rre. The RF power source 3, the coupling capacitor 4, and the electrodes 5 and 6 constitute the plasma generating means.

The present embodiment is characterized in that a window 40 for monitoring the plasma in the chamber 1, a emission-intensity measuring device 70 (photomultiplier), and a controller 71 for receiving the output from the emission-intensity measuring device 70 to control the dry-etching process are further provided. A reference numeral 41 designates a deposit composed of an etching by-product deposited on the interior wall of the window 40.

In the present embodiment also, dry etching is performed under the same conditions as used in the above first embodiment. Specifically, a mixture of $CF_4$ gas, $CHF_3$ gas, and Ar gas as an etching gas is introduced into the chamber 1 and subjected to discharging under a pressure of 60 mTorr. The power applied in the step is 400 W. The plasma generation region 10 is thus formed and an active species serving as an etchant is directed to the silicon dioxide film of the sample 22. The etching by-product formed through the reaction is a compound mainly composed of Si and C. The compound is partly discharged from the chamber 1, while the remaining portion thereof is deposited on the interior wall of the chamber 1 and on the monitor window 40.

At this stage, in the present embodiment, the controller 71 is used to judge the time at which dry etching should be completed based on variations in the emission intensity of the plasma measured by the emission-intensity measuring device 70. A detailed description will be given below to the foregoing process.

Figure 14:
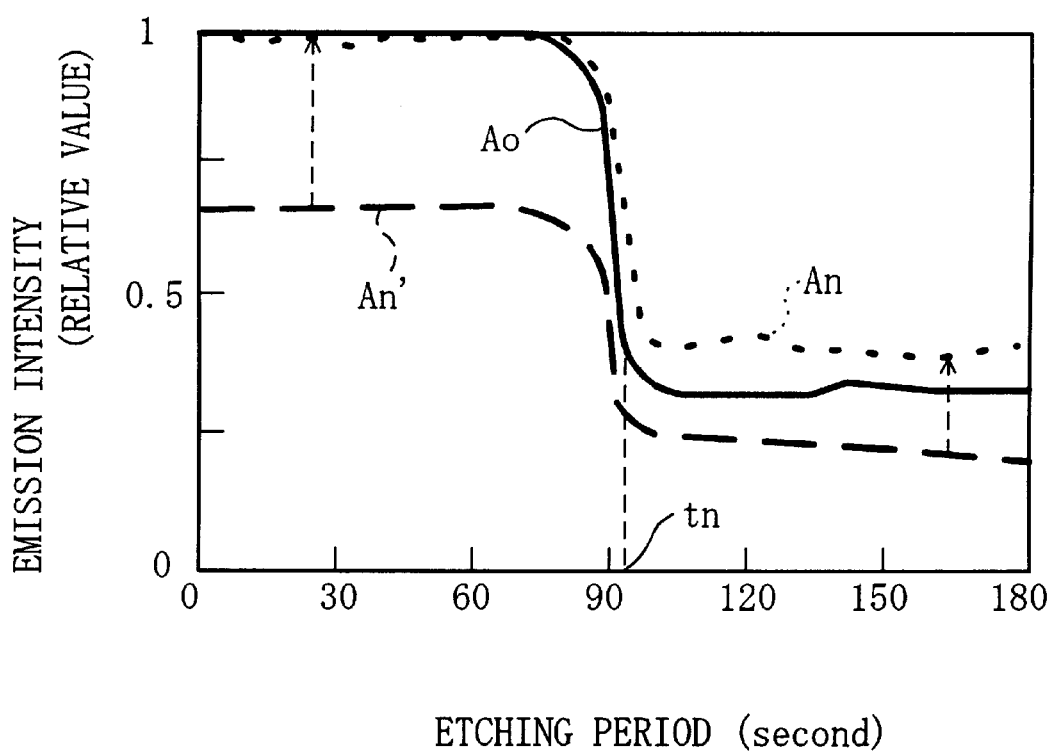
FIG. 14 illustrates a method of judging the timing of completing etching through the compensation of an initial value according to the seventh embodiment.

FIG. 14 illustrates a method of timing the completion of dry etching, wherein the vertical axis represents variations in emission intensity at a wavelength of 483.5 nm of CO molecules. In partially removing a silicon dioxide film in a semiconductor device by dry etching using $CF_4$ gas, a plasma of particles of $SiF_4$, $CO_2$, CO, and the like is produced. Although the number of the particles should drastically be reduced after the removal of the silicon dioxide film is completed, $SiF_4$ continues to be generated even after the removal of the silicon dioxide film is completed when the underlay is silicon. Accordingly, the time point at which the removal of the silicon dioxide film is completed can be judged on the basis of the emission intensity of $CO_2$, CO, and the like.

Thus, by utilizing a drastic reduction in the emission intensity of the plasma of specific particles generated during dry etching (CO particles in the present embodiment), the time at which dry etching should be completed can be determined. For example, in the case of performing dry etching in the chamber 1 immediately after cleaning, the initial value of the relative intensity before the dry etching of a wafer is initiated is assumed to be "1." When dry etching proceeds and the relative value of the emission intensity drastically decreases at the time t0, the time t0 is judged to be the time at which dry etching should be completed. However, since the thickness of the deposit 41 on the inner surface of the window 40 increases after a large number of wafers were processed, as indicated by the curve An' in the drawing, the emission intensity measured is reduced before the initiation of dry etching as well as after the completion of dry etching due to the absorption of light by the deposit, compared with the intensity obtained immediately after cleaning.

To prevent such a reduction in emission intensity, the present embodiment automatically compensates the sensitivity of measurement so that the initial value of the emission intensity before dry etching is initiated is constantly "1" (auto-gain adjustment). Specifically, as indicated by the curve An in FIG. 14, when dry etching is performed after n wafers were processed, auto-gain adjustment is performed whereby the initial value of the relative emission intensity is assumed to be "1" so that, when the relative emission intensity reaches a given level (e.g., 0.6) or lower (the time tn shown in FIG. 14), it is judged that dry etching should be completed. In this manner, since the completion of dry etching can be timed based on the relative emission intensity reaching a given value (e.g., 0.6) or lower as a result of the auto-gain adjustment, the process control is extremely simplified. Furthermore, since the labor of mounting a wafer for monitoring and the interruption of the process each for detecting the state of generated particles in the chamber can be prevented, a misjudgment which might be made merely from the number of processed wafers can be avoided.

Eighth Embodiment

Next, an eighth embodiment will be described with reference to FIGS. 15, 16, and 17.

Figure 15:
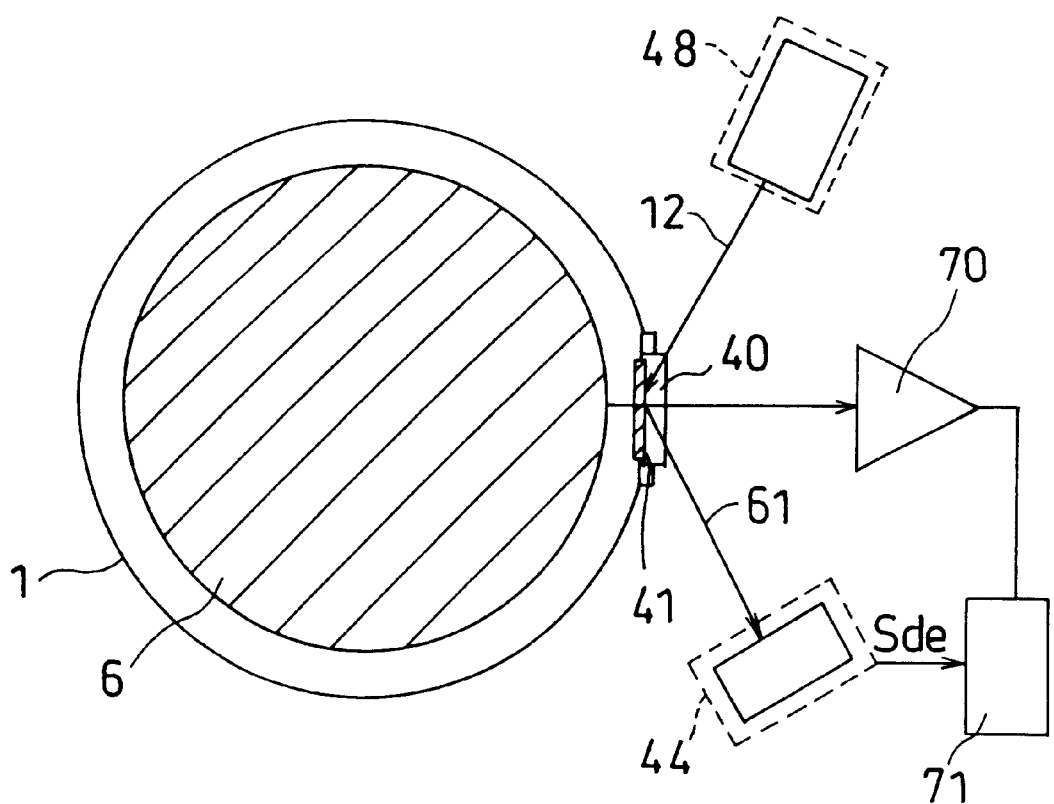
FIG. 15 is a transverse cross-sectional view of a semiconductor manufacturing apparatus according to an eighth embodiment.

FIG. 15 is a transverse cross-sectional view of a dry-etching apparatus according to the present embodiment. The dry-etching apparatus according to the present embodiment has substantially the same construction as the dry-etching apparatus according to the above seventh embodiment, except that the present embodiment has the function of monitoring the state of a plasma as well as the function of controlling the dry-etching process. Specifically, an infrared light source and optical system 48 and an infrared-ray measuring/analyzing system 44 each having the same construction as in the above sixth embodiment are provided. The infrared ray entering a window 40 is totally reflected from the inner surface thereof by the infrared light and optical system 48 to reach the infrared-ray measuring/analyzing system 44. The infrared-ray measuring/analyzing system 44 transmits a signal Sde pertaining to the deposit 41 in the inner surface of the window 40 to a controller 71 as mentioned above.

In the present embodiment also, dry etching is performed under the same conditions as used in the above seventh embodiment. In the present embodiment, the time at which dry etching should be completed is judged by the controller 71 based on variations in the emission intensity of the plasma measured by a emission-intensity detecting means 70, similarly to the above seventh embodiment. However, the present embodiment is different from the above seventh embodiment in a method of compensating the initial value before the dry etching of a wafer is initiated.

Figure 16:
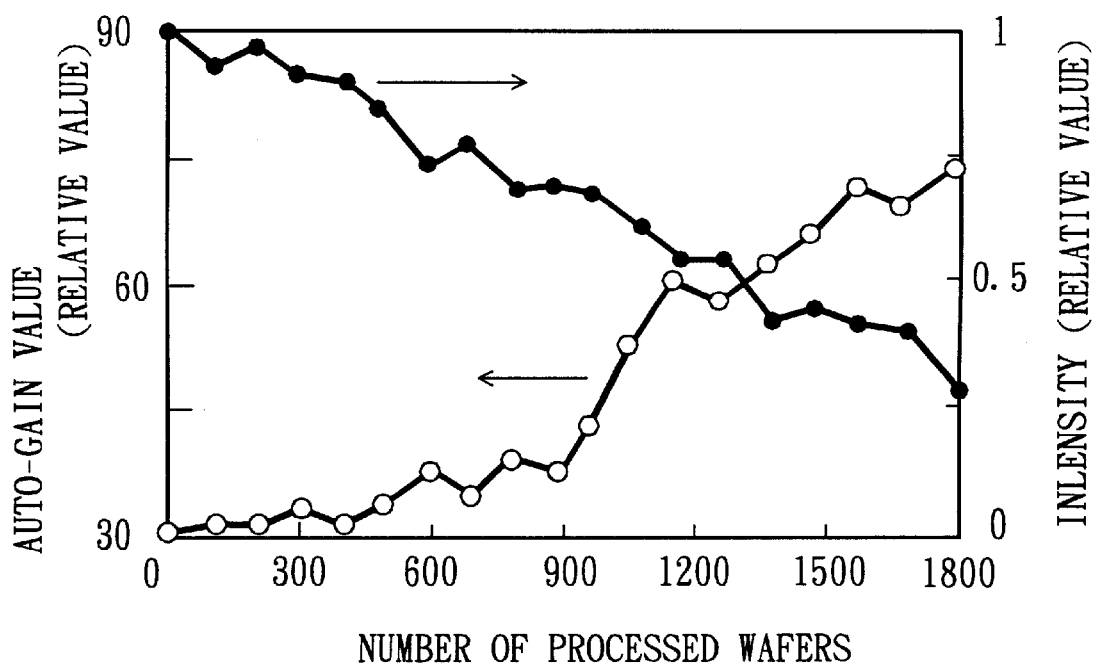
FIG. 16 shows variations in the intensity of an infrared ray caused by the deposit and an auto-gain value adjusted based on the variations in the eighth embodiment.
Figure 17:
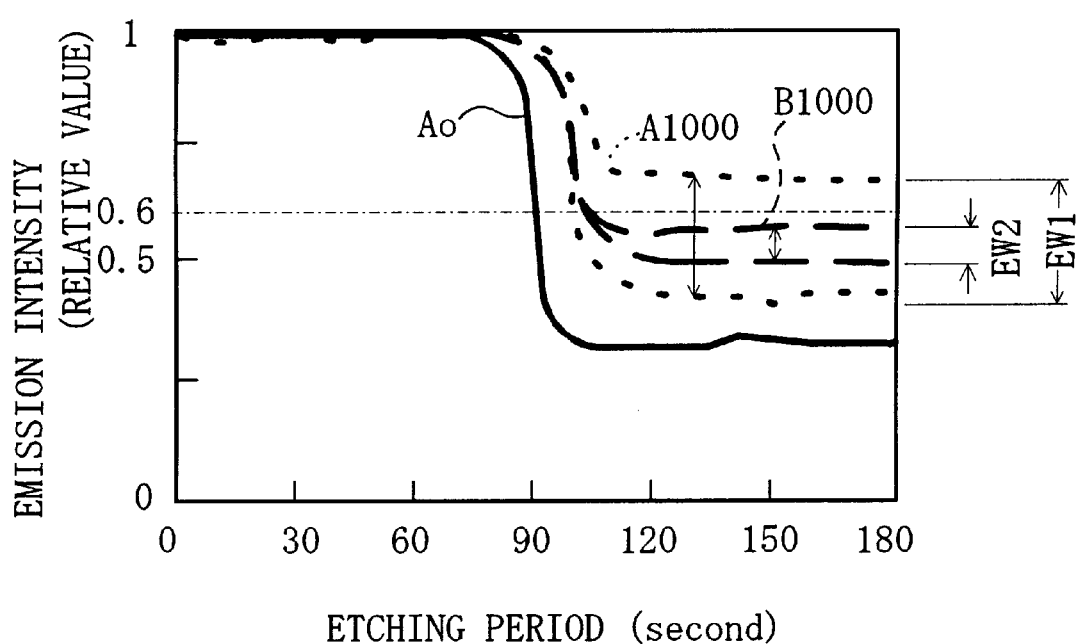
FIG. 17 shows methods of judging the timing of completing etching through the compensation of the initial value according to the seventh and eighth embodiments, which are provided for comparison in terms of reliability.

FIG. 16 shows variations in the intensity of the infrared ray measured by the infrared-ray measuring/analyzing system 44 and variations in the auto-gain value (relative value) of the controller 70 adjusted based on the intensity variations. Specifically, the auto-gain value is adjusted so that the relative emission intensity of the plasma before dry etching is initiated becomes constantly "1" based on the intensity of the infrared ray passing through the deposit 41 on the inner surface of the window 40 represented by the signal Sde transmitted from the infrared-ray measuring/analyzing system 44.

When the auto-gain adjustment as performed in the seventh embodiment is performed, the increment of the gain becomes larger as the deposit 41 attached on the window 40 becomes thicker. When the increment of the gain becomes larger, however, an apparent difference between the emission intensity before the dry etching of the wafer is initiated and the emission intensity at the completion of dry etching tends to be smaller than the actual difference. In other words, when the initial value of the relative emission intensity is compensated to be "1," the emission intensity measured at the completion of dry etching tends to increase compared with that measured immediately after cleaning (see the curve An in FIG. 14). The fluctuation range of the emission intensity after the completion of dry etching also increases due to a reduction in the S/N ratio. The value measured by the emission-intensity measuring device 70 (photomultiplier) varies due to not only the deposit 41 on the window 40 but also dust or the like in the chamber 1, while it also varies greatly with the passage of time. If the initial value is compensated based on the value measured by the emission-intensity measuring device 70, when the 1000-th wafer, e.g., is subjected to dry etching as indicated by the dotted curve A1000 in FIG. 17, the value of the emission intensity after the completion of etching eventually has the wide fluctuation range EW1. There may be cases where the emission intensity has a value higher than "0.6," which is the standard value for judging the time at which etching should be completed, though etching has actually been completed. As a result, the time at which etching should be completed may be misjudged due to the combined effect of the tendency of the value measured after the completion of etching to increase with an increase in auto-gain value, an increase in error, and inaccurate compensation of the initial value. To avoid the misjudgment, if the auto gain surpasses a given value, e.g., dry cleaning (maintenance) should be performed in the chamber 1 in order to remove the deposit 41 from the window 40, since otherwise the time at which etching should be completed may be misjudged. As a result, the chamber 1 is prematurely subjected to dry cleaning despite the deposit 41 actually in a tolerable state, resulting in a shorter maintenance cycle.

In the case of using data transmitted from the infrared-ray measuring/analyzing system 44 as in the present embodiment, there is no significant variation in the measured value comparable to that obtained when the emission-intensity measuring device 70 is used. As indicated by the dashed curve B1000 in FIG. 17, the fluctuation range EW2 of the emission intensity measured after the completion of etching becomes extremely narrow. Thus, the method of the present embodiment involves actual measurement of the film thickness of the deposit 41 and compensation of the initial value based on the obtained value, so that the number of wafers that can be processed till the standard value of "0.6" for judging the timing of completing etching is reached increases due to the narrow fluctuation range EW2, despite the increasing tendency of the relative emission intensity after the completion of etching accompanying the auto-gain adjustment. For example, if the maximum number of wafers that can be processed between two consecutive dry-cleaning processes performed with respect to the chamber 1 is assumedly 1000 in the seventh embodiment, about 1100 wafers can be processed in the present embodiment. Since the dry-cleaning of the chamber 1 interrupts processing and requires much labor of ventilating the atmosphere in the chamber 1, the availability of the apparatus is greatly improved by thus extending the maintenance cycle.

Other Embodiments

Figure 9A:
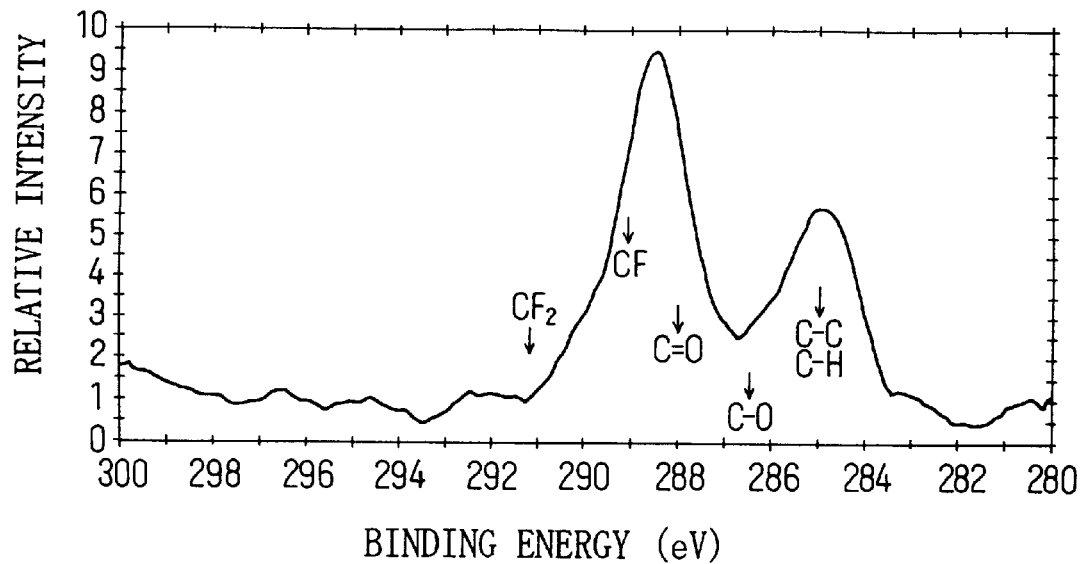
FIGS. 9(a) and 9(b) show respective spectra measured by monitoring deposits produced during the etching of a polysilicon film and a silicon dioxide film by X-ray photoelectron spectroscopy.
Figure 9B:
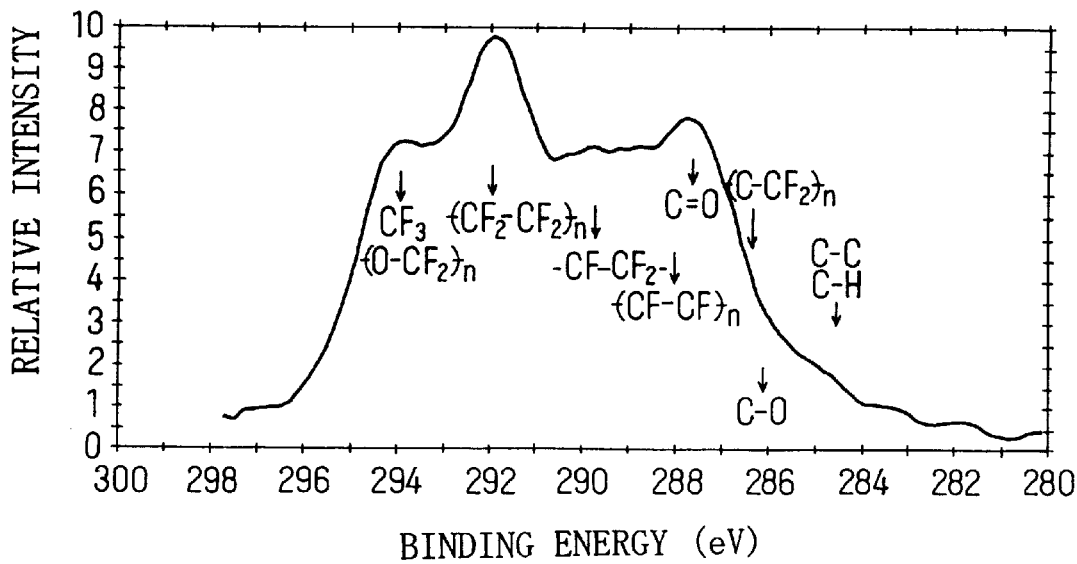

Although each of the above and below embodiments describes the case where an infrared ray is used as the magnetic wave to examine the environment in the reaction room by monitoring the absorption spectrum of the infrared ray, the present invention is not limited to the embodiments. It is also possible to obtain information on the inside of the reaction room by using an optical technique other than the absorption of the infrared ray, such as X-ray photoelectron spectroscopy. FIG. 9(a) shows the result of analyzing a deposit in the process of etching the same polysilicon film as used in the first embodiment and FIG. 9(b) shows the result of analyzing a deposit in the process of etching the same silicon dioxide film as used in the second embodiment, each of which shows the spectrum of binding energy between the individual atoms composing the deposit (the vertical axis in the drawing represents the relative intensity of photoelectrons. As will be easily understood from FIGS. 9(a) and 9(b), a difference between the spectra of binding energy of materials composing respective deposited films produced during etching process is observed and the intensities thereof reflect the total amounts of the deposits. As a result, the environment in the chamber can be monitored by X-ray photoelectron spectroscopy.

Although each of the above embodiments describes the case where the environment in the chamber is examined when etching is performed using a plasma, the present invention is not limited to the embodiments but is applicable to all types of plasma-assisted processing including CVD, ashing, oxidation, impurity doping, and plasma-assisted epitaxy each of which involves the use of a plasma or to all types of processing that may produce a deposit on the interior wall of the chamber including sputtering, vapor deposition, CVD, and ion plating each of which does not involve the use of a plasma.

We claim:

1. A semiconductor manufacturing apparatus comprising:

a chamber;

a cylindrical monitoring member composed of a protruding portion of a wall surface constituting the chamber and closed at its tip;

a window for electromagnetic wave provided in a part of said cylindrical monitoring member and permitting at least any one of electromagnetic waves including a light beam, an X-ray beam, and an electron beam to pass therethrough;

electromagnetic-wave generating means for generating said electromagnetic wave;

electromagnetic-wave measuring means for measuring absorption of the electromagnetic wave by a deposit in said chamber after the electromagnetic wave passes through the deposit; and transmission-path adjusting means for adjusting a transmission path of the electromagnetic wave such that the electromagnetic wave generated from said electromagnetic-wave generating means is directed to said deposit through said window for electromagnetic wave and ejected from the chamber to an outside thereof after passing through the deposit to reach said electromagnetic-wave measuring means.

2. A semiconductor manufacturing apparatus according to claim 1, wherein said electromagnetic-wave generating means is for generating an infrared ray and said electromagnetic-wave measuring means is an infrared-ray measuring device for measuring an absorption spectrum of the infrared ray.

3. A semiconductor manufacturing apparatus according to claim 1, further comprising:

a second cylindrical monitoring member composed of another protruding portion of the wall surface constituting the chamber and closed at its tip; and a second window for electromagnetic wave provided in a part of said second cylindrical monitoring member and permitting at least any of one of electromagnetic waves including a light beam, an x-ray beam, and an electron beam to pass therethrough;

wherein said cylindrical monitoring member and said second cylindrical monitoring member are provided at two opposing positions of said camber; and said transmission-path adjusting means introduces into the chamber the electromagnetic wave generated from said electromagnetic-wave generating means and passing through the deposit attached on said window for electromagnetic wave and ejects the electromagnetic wave through said second window for electromagnetic wave such that the electromagnetic wave reaches said electromagnetic-wave measuring means.

4. A semiconductor manufacturing apparatus according to claim 1, further comprising:

a second cylindrical monitoring member composed of another protruding portion of the wall surface constituting the chamber and closed at its tip; and a second window for electromagnetic wave provided in a Dart of said second cylindrical monitoring member and permitting at least any of one of electromagnetic waves including a light beam, an x-ray beam, and an electron beam to pass therethrough;

wherein said cylindrical monitoring member and said second cylindrical monitoring member are provided at two opposing positions of said camber; and said transmission-path adjusting means introduces into the chamber the electromagnetic wave generated from said electromagnetic-wave generating means through said window for electromagnetic wave, directs the electromagnetic wave to the deposit attached on an arbitrary portion of an interior wall of said chamber located between said window for electromagnetic wave and said second window for electromagnetic wave, and ejects the electromagnetic wave reflected from the deposit from said chamber to the outside thereof through said second window for electromagnetic wave such that the electromagnetic wave reaches said electromagnetic-wave measuring means.

5. A semiconductor manufacturing apparatus according to claim 1, further comprising:

a second window for electromagnetic wave provided in a different part of said cylindrical monitoring member, said second window for electromagnetic wave opposing said window for electromagnetic wave; and wherein said transmission-path adjusting means introduces the electromagnetic wave into the cylindrical monitoring member through said window for electromagnetic wave and ejects the electromagnetic wave passing through and reflected from the deposit on an inner surface of the tip from said cylindrical monitoring member to an outside thereof through said second window for electromagnetic wave such that the electromagnetic wave reaches said electromagnetic-wave measuring means.

6. A semiconductor manufacturing apparatus according to claim 1, wherein said cylindrical monitoring member is detachably constructed at one portion thereof.

7. A semiconductor manufacturing apparatus according to claim 1, wherein said transmission-path adjusting means has a filter for limiting a wave number of the electromagnetic wave passing through to a given range determined based on the type of a material to be processed.

8. A semiconductor manufacturing apparatus comprising:

a chamber;

a cylindrical monitoring member composed of a protruding portion of a wall surface constituting the chamber and closed at its tip;

a window for electromagnetic wave provided in a part of said cylindrical monitoring member and permitting at least any one of electromagnetic waves including a light beam, an x-ray beam, and an electron beam to pass therethrough;

electromagnetic-wave generating means for generating said electromagnetic wave;

electromagnetic-wave measuring means for measuring absorption of the electromagnetic wave by a deposit in said chamber after the electromagnetic wave passes through the deposit;

transmission-path adjusting means for adjusting a transmission path of the electromagnetic wave such that the electromagnetic wave generated from said electromagnetic-wave generating means is directed to said deposit on an inner surface of said window for electromagnetic wave through said window for electromagnetic wave and elected from the chamber to an outside thereof after passing through the deposit to reach said electromagnetic-wave measuring means;

plasma generating means for ionizing gas introduced into said chamber with an RF electric field to generate a plasma;

a window for plasma provided in said chamber and permitting light emitted from the plasma in the chamber to pass therethrough;

emission-intensity measuring means for measuring an emission intensity of the plasma in the chamber through said window for plasma;

process control means for receiving an output from said emission-intensity measuring means, compensating a sensitivity with which the emission intensity is measured such that the emission intensity in performing plasma processing has a constant initial value, and performing process control with respect to the plasma processing based on a variation in the compensated emission intensity; and data transfer means for inputting to said process control means the amount of absorption of said electromagnetic wave by said deposit measured by said electromagnetic-wave measuring means; and wherein said process control means compensates the sensitivity with which said emission intensity is measured based on the amount of absorption of said electromagnetic wave by said deposit transferred from said data transfer means.

9. A semiconductor manufacturing apparatus according to claim 8, wherein said process control means performs the process control of determining a time at which dry etching should be completed.

10. A semiconductor manufacturing apparatus according to claim 8, wherein said transmission-path adjusting means adjusts the transmission path of the electromagnetic wave such that the electromagnetic wave entering said window for electromagnetic wave from an outside thereof is totally reflected by an inner surface of said window for electromagnetic wave and ejected to the outside of the window for electromagnetic wave.

* * * * *

UNITED STATES PATENT AND TRADEMARK OFFICE
CERTIFICATE OF CORRECTION

PATENT NO. : 5,985,032
DATED : November 16, 1999
INVENTOR(S) : Eriguchi

It is certified that error appears in the above-identified patent and that said Letters Patent is hereby corrected as shown below:

On the Cover Page: and col. 1,

In the Title section, change "SEMICONDUCTOR MANUFACTURING APPARATUS" to -- METHOD OF MONITORING DEPOSIT IN CHAMBER, METHOD OF PLASMA PROCESSING, METHOD OF DRY-CLEANING CHAMBER, AND SEMICONDUCTOR MANUFACTURING APPARATUS--.

Claim 4, line 7, change "Dart" to --part--.

Signed and Sealed this

Fifth Day of December, 2000

*Attest:*

Q. TODD DICKINSON

*Attesting Officer*     *Director of Patents and Trademarks*